(12) United States Patent
Schultze

(10) Patent No.: US 10,397,030 B2
(45) Date of Patent: *Aug. 27, 2019

(54) RECEIVER FOR HIGH SPECTRAL EFFICIENCY DATA COMMUNICATIONS SYSTEM USING ENCODED SINUSOIDAL WAVEFORMS

(71) Applicant: Terawave, LLC, Naples, FL (US)

(72) Inventor: Torsten Schultze, Hamburg (DE)

(73) Assignee: TeraWave, LLC

( * ) Notice: Subject to any disclaimer, the term of this patent is extended or adjusted under 35 U.S.C. 154(b) by 0 days.

This patent is subject to a terminal disclaimer.

(21) Appl. No.: 16/264,497

(22) Filed: Jan. 31, 2019

(65) Prior Publication Data

US 2019/0165973 A1    May 30, 2019

Related U.S. Application Data

(63) Continuation of application No. 16/174,198, filed on Oct. 29, 2018.
(Continued)

(51) Int. Cl.
*H04L 1/00* (2006.01)
*H04L 25/06* (2006.01)
*H04L 25/49* (2006.01)

(52) U.S. Cl.
CPC ........ *H04L 25/4921* (2013.01); *H04L 1/0045* (2013.01); *H04L 25/069* (2013.01)

(58) Field of Classification Search
USPC .......................................................... 375/286
See application file for complete search history.

(56) References Cited

U.S. PATENT DOCUMENTS 4,716,376 A * 12/1987 Daudelin ............ H04L 27/1563
329/300
5,930,303 A     7/1999 Walker
(Continued)

FOREIGN PATENT DOCUMENTS

WO    WO-2005/025166 A1    3/2005
WO    WO-2005/101775 A2    10/2005
(Continued)

OTHER PUBLICATIONS

International Search Report dated Mar. 22, 2019, for PCT Application No. PCT/US2018/058054, filed Oct. 29, 2018, 4 pages.
(Continued)

*Primary Examiner* — Wednel Cadeau
(74) *Attorney, Agent, or Firm* — Cooley LLP

(57) ABSTRACT

A method of recovering information encoded by a modulated sinusoidal waveform having first, second, third and fourth data notches at respective phase angles, where a power of the modulated sinusoidal waveform is reduced relative to a power of an unmodulated sinusoidal waveform within selected ones of the first, second, third and fourth data notches so as to encode input digital data. The method includes receiving the modulated sinusoidal waveform and generating digital values representing the modulated sinusoidal waveform. A digital representation of the unmodulated sinusoidal waveform is subtracted from the digital values in order to generate a received digital data sequence, which includes digital data notch values representative of the amplitude of the modulated sinusoidal waveform within the first, second, third and fourth data notches. The input digital data is then estimated based upon the digital data notch values.

30 Claims, 27 Drawing Sheets

Related U.S. Application Data

(60) Provisional application No. 62/689,764, filed on Jun. 25, 2018, provisional application No. 62/578,332, filed on Oct. 27, 2017.

(56) References Cited

U.S. PATENT DOCUMENTS

| | | |
|---|---|---|
| 6,445,737 B1 | 9/2002 | Walker |
| 6,621,426 B1 | 9/2003 | van Nguyen |
| 6,748,022 B1 | 6/2004 | Walker |
| 7,046,741 B2 | 5/2006 | Brown et al. |
| 7,268,638 B2 | 9/2007 | Walker |
| 7,298,795 B2 | 11/2007 | Brown et al. |
| 7,298,796 B2 | 11/2007 | Brown et al. |
| 7,310,383 B2 | 12/2007 | D'Alessandro et al. |
| 7,310,384 B2 | 12/2007 | Brown et al. |
| 7,310,385 B2 | 12/2007 | Brown et al. |
| 7,313,200 B2 | 12/2007 | Brown et al. |
| 7,340,012 B2 | 3/2008 | Brown et al. |
| 7,424,065 B2 | 9/2008 | Walker |
| 9,407,203 B2 | 8/2016 | Lee |
| 9,774,348 B2 | 9/2017 | Lee |
| 2002/0110190 A1 | 8/2002 | Walker |
| 2003/0012301 A1 | 1/2003 | Walker |
| 2003/0215009 A1 | 11/2003 | Walker |
| 2004/0121731 A1 | 6/2004 | Walker |
| 2005/0048931 A1 | 3/2005 | Wortel et al. |
| 2005/0232368 A1 | 10/2005 | Brown et al. |
| 2005/0286645 A1 | 12/2005 | D'Alessandro et al. |
| 2006/0215770 A1 | 9/2006 | Brown et al. |
| 2006/0222105 A1 | 10/2006 | Brown et al. |
| 2006/0233267 A1 | 10/2006 | Brown et al. |
| 2006/0256893 A1 | 11/2006 | Brown et al. |
| 2006/0262866 A1 | 11/2006 | Brown et al. |
| 2007/0237218 A1 | 10/2007 | Walker |
| 2007/0274415 A9* | 11/2007 | Brown .................. H03J 1/005 375/320 |
| 2008/0253479 A1 | 10/2008 | Davidow et al. |
| 2011/0292984 A1* | 12/2011 | Yoshimoto .......... H04L 27/0014 375/224 |
| 2012/0288044 A1 | 11/2012 | Roberts et al. |
| 2015/0194930 A1 | 7/2015 | Lee |
| 2015/0349993 A1 | 12/2015 | Tyrrell |
| 2017/0041020 A1 | 2/2017 | Lee |
| 2018/0013603 A1 | 1/2018 | Lee |
| 2019/0132166 A1 | 5/2019 | Schultze |
| 2019/0132167 A1 | 5/2019 | Schultze |
| 2019/0132174 A1 | 5/2019 | Schultze |
| 2019/0132175 A1 | 5/2019 | Schultze |
| 2019/0140873 A1 | 5/2019 | Schultze |
| 2019/0140882 A1 | 5/2019 | Schultze |

FOREIGN PATENT DOCUMENTS

| | | |
|---|---|---|
| WO | WO-2005/101775 A3 | 10/2005 |
| WO | WO-2005/101776 A2 | 10/2005 |
| WO | WO-2005/101776 A3 | 10/2005 |
| WO | WO-2005/107201 A2 | 11/2005 |
| WO | WO-2005/107201 A3 | 11/2005 |
| WO | WO-2008/033586 A1 | 3/2008 |
| WO | WO-2008/097966 A2 | 8/2008 |
| WO | WO-2008/097966 A3 | 8/2008 |
| WO | WO-2015/105744 A1 | 7/2015 |

OTHER PUBLICATIONS

International Search Report dated Mar. 27, 2019, for PCT Application No. PCT/US2018/058055, filed Oct. 29, 2018, 4 pages.
International Search Report dated Feb. 8, 2019, for PCT Application No. PCT/US2018/058056, filed Oct. 29, 2018, 2 pages.
Written Opinion of the International Searching Authority dated Mar. 22, 2019, for PCT Application No. PCT/US2018/058054, filed Oct. 29, 2018, 6 pages.
Written Opinion of the International Searching Authority dated Mar. 27, 2019, for PCT Application No. PCT/US2018/058055, filed Oct. 29, 2018, 10 pages.
Written Opinion of the International Searching Authority dated Feb. 8, 2019, for PCT Application No. PCT/US2018/058056, filed Oct. 29, 2018, 6 pages.
Karn, P. (2000). "The VMSK Delusion," 14 total pages.
Karn, P. (2000). "Response to Walker's Rebuttal," 5 total pages.
Keenan, R. (2002). "Startup pitches narrowband wireless approach," EDN Network, located at https://www.edn.corn/electronics-news/4141590/Startup-pitches-narrowband-wireless-approach, 2 total pages.
Strassberg, D (2000). "VMSK/2: High bps, low BW, (allegedly), no snake oil," EDN Network, with Figures 1-4 attached, located at https://www.edn.com/design/communications-networking/4360711/VMSK-2-high-bps-low-BW—allegedly-no-snake-oil, 9 total pages.

* cited by examiner

| Angle | % Power Reduction | Value |
|---|---|---|
| 45 | 30 | 1 |
| 135 | 15 | 0 |
| 225 | 15 | 0 |
| 315 | 30 | 1 |

1, 1, 1, 1

1, 0, 1, 0

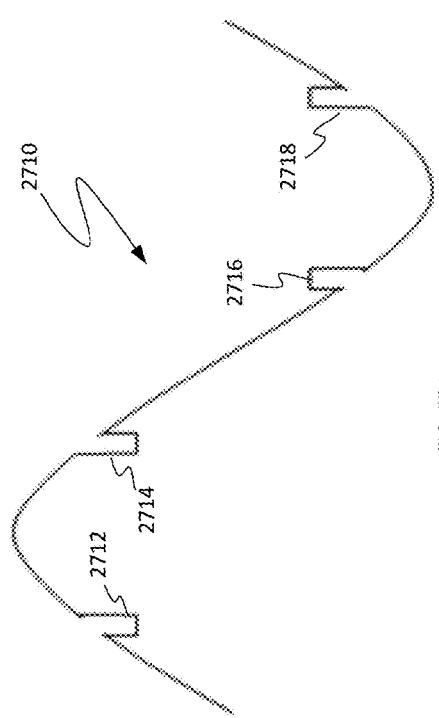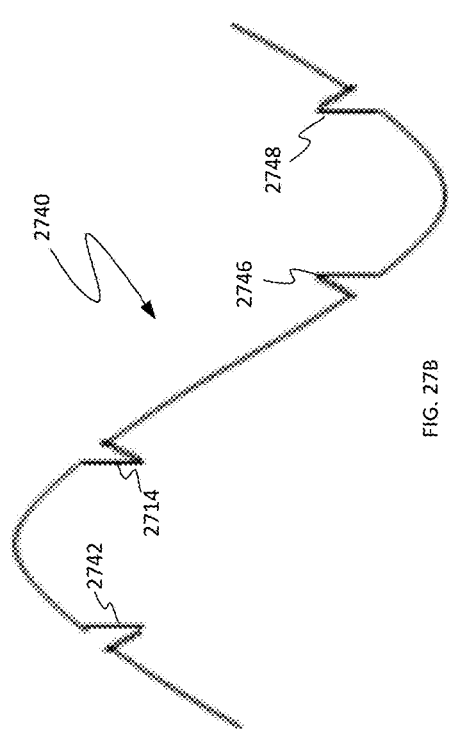

RECEIVER FOR HIGH SPECTRAL EFFICIENCY DATA COMMUNICATIONS SYSTEM USING ENCODED SINUSOIDAL WAVEFORMS

CROSS-REFERENCE TO RELATED APPLICATIONS

This application is a continuation of U.S. application Ser. No. 16/174,198, entitled RECEIVER FOR HIGH SPECTRAL EFFICIENCY DATA COMMUNICATIONS SYSTEM USING ENCODED SINUSOIDAL WAVEFORMS, filed on Oct. 29, 2018, which claims the benefit of priority under 35 U.S.C. § 119(e) of U.S. Provisional Patent Application No. 62/578,332, entitled DATA COMMUNICATIONS SYSTEM WITH HIGH SPECTRAL EFFICIENCY, filed on Oct. 27, 2017, and of U.S. Provisional Patent Application No. 62/689,764, entitled HIGH SPECTRAL EFFICIENCY DATA COMMUNICATIONS SYSTEM USING PERIODIC WAVEFORM MODULATION, filed on Jun. 25, 2018, the content of each of which is incorporated herein by reference in its entirety for all purposes.

FIELD

The present disclosure pertains generally to data communication systems and, in particular, methods and systems for data communication based upon sine wave modulation.

BACKGROUND

There are various transmission channels used for transmitting data or information. Telephone lines consisting of copper wires were used for well over a hundred years for transmitting both voice and data. Radio transmission of radio signals have been around for almost a hundred years. A radio station sends a radio signal out over the airwaves to be received by a radio set. As is known, a radio station has programming which may include music, news, or programs. Satellites are an example of another transmission channel in which a satellite dish positioned a first location is used to transmit a signal to a satellite to be beamed or sent from the satellite to a second satellite dish positioned at a location remote from the first location. More recently cellular communication systems have been used to communicate between cell phones. An enormous amount of data is being sent using cellular communication systems. At this point in time it is essential to be able to increase the data throughput over any transmission channel that is used. It is also important to address the problem of signal degradation during transmission of the signal. Some problems encountered when transmitting a signal over a transmission channel include transmission path delay, interference, and non-linearity.

Some transmission techniques or schemes that have been developed and used in an effort to increase data throughput over a transmission channel are Amplitude Modulation (AM), Frequency Modulation (FM), Phase Modulation, QAM (Quadrature Amplitude Modulation), QPSK (Quadrature Phase Shift Keying), PSK (Phase Shift Keying), and APSK (Amplitude and Phase Shift Keying).

Amplitude Modulation is a modulation technique used for transmitting information by use of a radio carrier wave. A sinusoidal carrier wave has its amplitude modulated by an audio waveform before transmission. The audio waveform modifies the amplitude of the sinusoidal carrier wave. Some disadvantages associated with the use of an amplitude modulation signal are that an amplitude modulation signal is not efficient in terms of its power usage, it is not efficient in terms of its use of bandwidth, it requires a bandwidth equal to twice that of the highest audio frequency, and it is prone to high levels of noise.

Frequency Modulation is a modulation technique that encodes information in a carrier wave by varying the frequency of the wave. Although Frequency Modulation has some advantages over Amplitude Modulation some disadvantages include that it requires a more complicated demodulator and that is has a poorer spectral efficiency than some other modulation techniques.

QAM is a form of multilevel amplitude and phase modulation that modulates a source signal into an output waveform with varying amplitude and phase. A system that employs QAM modulates a source signal into an output waveform with varying amplitude and phase. A message to be transmitted is mapped to a two-dimensional four quadrant signal space or constellation having signal points or phasors each representing a possible transmission level. Each signal point in the constellation is referred to as a symbol. The QAM constellation has a coordinate system defined by an I or in-phase axis and a Q or quadrature axis or an IQ plane. A symbol may be represented by both I and Q components. One of the disadvantages of the use of QAM is that for the higher data rates the peak to average power ratio is high. For example, in a typical constellation diagram for 16QAM, it can be seen that there are four possible power levels. As the order of the modulation increases, so the number of power levels needed increases. All of this results in ever higher peak to average power ratios being experienced.

QPSK has a synchronous data stream modulated onto a carrier frequency before being over a channel. The carrier can have four states such as 45°, 135°, 225°, or 315°. QPSK also employs a quadrature modulation where the signal points can be described using two orthogonal coordinate axes, such as the IQ plane. With conventional QPSK, there is the problem that the transition between two diagonal transmission symbol points in the complex plane passes through the zero point. In the transition between these diagonal transmission symbols, a lowering of the amplitude may occur, the so-called envelope, to practically zero. On the receiver side, it complicates the necessary synchronization and favors nonlinearities in the transmission path, signal distortion, and unwanted intermodulation.

PSK is another digital modulation process which transmits a message by modulating the phase of a carrier wave. One disadvantage of using PSK is that when a high order PSK constellation is used the error-rate becomes too high.

As the name APSK indicates, this form of modulation uses amplitude and phase shift keying. In this modulation scheme a signal is conveyed by modulating both the amplitude and the phase of a carrier wave. Amplitude and frequency shift keying is able to reduce the number of power levels required to transmit information for any given modulation order.

SUMMARY

In one aspect the disclosure relates to a method for periodic waveform modulation. The method includes receiving input digital data and encoding the input digital data at selected phase angles $\Theta_1$, $\Theta_2$, $\Theta_3$, $\Theta_4$ of an unmodulated sinusoidal waveform in order to create a modulated sinusoidal waveform. The encoding process includes selectively reducing a power of the unmodulated sinusoidal waveform at ones of the selected phase angles $\Theta_1$, $\Theta_2$, $\Theta_3$, $\Theta_4$ in accordance with bit values of the input digital data so as to respectively define first, second, third and fourth data notches in the modulated sinusoidal waveform. An encoded analog waveform is then generated, using a digital-to-analog converter, from a digital representation of the modulated sinusoidal waveform. The data notches are formed such that a first energy corresponding to a first cumulative power difference between a power of the modulated sinusoidal waveform and a power of the unmodulated sinusoidal waveform over a first phase angle range subtended by the first data notch is substantially equal to a third energy corresponding to a third cumulative power difference between the power of the modulated sinusoidal waveform and the power of the unmodulated sinusoidal waveform over a third phase angle range subtended by the third data notch. The data notches are also formed such that a second energy corresponding to a second cumulative power difference between the power of the modulated sinusoidal waveform and the power of the unmodulated sinusoidal waveform over a second phase angle range subtended by the second data notch is substantially equal to a fourth energy corresponding to a fourth cumulative power difference between the power of the modulated sinusoidal waveform and the power of the unmodulated sinusoidal waveform over a fourth phase angle range subtended by the fourth data notch.

In one embodiment the phase angle $\Theta_3$ is equal to the sum of the phase angle $\Theta_1$ and 180° and the phase angle $\Theta_4$ is equal to the sum of the phase angle $\Theta_2$ and 180°. In another embodiment the phase angle $\Theta_1$ is between 44.5° and 45.5°, the phase angle $\Theta_2$ is between 134.5° and 135.5°, the phase angle $\Theta_3$ is between 224.5° to 225.5°, and the phase angle $\Theta_4$ is between 314.5° to 315.5°.

In one embodiment the first data notch is representative of a first bit value of the bit values and the second data notch is representative of a second bit value of the bit values. In one implementation a minimum amplitude of the first data notch is a first percentage of the amplitude of the unmodulated sinusoidal waveform at the phase angle $\Theta_1$ and a minimum amplitude of the second data notch is a second percentage of the amplitude of the unmodulated sinusoidal waveform at the phase angle $\Theta_2$, the first percentage being different from the second percentage. When the first data notch is representative of a first plurality of the bit values it may include a first plurality of transition features respectively representative of the first plurality of the bit values. In this case the third data notch may be representative of a second plurality of the bit values and may include second plurality of transition features respectively representative of the second plurality of the bit values.

In a carrier-stacked implementation the unmodulated sinusoidal waveform is of a first frequency and additional input digital data is encoded at ones of the selected phase angles $\Theta_1$, $\Theta_2$, $\Theta_3$, $\Theta_4$ of an additional unmodulated sinusoidal waveform of a second frequency to create an additional modulated sinusoidal waveform. The encoding process includes selectively reducing a power of the additional unmodulated sinusoidal waveform at ones of the selected phase angles $\Theta_1$, $\Theta_2$, $\Theta_3$, $\Theta_4$ in accordance with bit values of the additional input digital data so as to respectively define additional first, second, third and fourth data notches in the additional modulated sinusoidal waveform. An additional encoded analog waveform is generated, using a digital-to-analog converter, from a digital representation of the additional modulated sinusoidal waveform. In this case an additional first cumulative power difference between a power of the additional modulated sinusoidal waveform and a power of the additional unmodulated sinusoidal waveform over an additional first phase angle range subtended by the additional first data notch is substantially equal to an additional third cumulative power difference between the power of the additional modulated sinusoidal waveform and the power of the additional unmodulated sinusoidal waveform over an additional third phase angle range subtended by the additional third data notch. Similarly, an additional second cumulative power difference between the power of the additional modulated sinusoidal waveform and the power of the additional unmodulated sinusoidal waveform over an additional second phase angle range subtended by the additional second data notch is substantially equal to an additional fourth cumulative power difference between the power of the additional modulated sinusoidal waveform and the power of the additional unmodulated sinusoidal waveform over an additional fourth phase angle range subtended by the additional fourth data notch.

In one embodiment the power of the unmodulated sinusoidal waveform is reduced in accordance with the bit values of the input digital data only at the phase angles $\Theta_1$ and $\Theta_3$. In this case the power of the unmodulated sinusoidal waveform may be reduced for purposes of energy balancing at the phase angles $\Theta_2$ and $\Theta_4$ independent of the input digital data.

The disclosure also pertains to a modulation method using carrier stacking which involves receiving input digital data and encoding the input digital data at selected phase angles of a plurality of sinusoidal waveforms so as to create a plurality of modulated sinusoidal waveforms. The method further includes generating an output analog waveform including a plurality of encoded analog communication signals corresponding to a plurality of digital representations of the plurality of modulated sinusoidal waveforms. In this case adjacent modulated sinusoidal waveforms are separated in frequency by less than 15 Hz and any sideband included within the output analog waveform is of a power at least 50 dB below a power of the encoded analog communication signal associated with the sideband.

The encoding process may include encoding the input digital data at phase angles $\Theta_1$, $\Theta_2$, $\Theta_3$, $\Theta_4$ of an unmodulated sinusoidal waveform to create a first modulated sinusoidal waveform by selectively reducing a power of the unmodulated sinusoidal waveform at ones of the phase angles $\Theta_1$, $\Theta_2$, $\Theta_3$, $\Theta_4$ in accordance with bit values of the input digital data, thereby respectively defining first, second, third and fourth data notches in the first modulated sinusoidal waveform. In this case a first cumulative power difference between a power of the first modulated sinusoidal waveform and a power of the unmodulated sinusoidal waveform over a first phase angle range subtended by the first data notch is substantially equal to a third cumulative power difference between the power of the first modulated sinusoidal waveform and the power of the unmodulated sinusoidal waveform over a third phase angle range subtended by the third data notch. In addition, a second cumulative power difference between the power of the first modulated sinusoidal waveform and the power of the unmodulated sinusoidal waveform over a second phase angle range subtended by the second data notch is substantially equal to a fourth cumulative power difference between the power of the first modulated sinusoidal waveform and the power of the unmodulated sinusoidal waveform over a fourth phase angle range subtended by the fourth data notch.

The subtraction process may include detecting zero crossings of the digital values representing the modulated sinusoidal waveform. In one embodiment the method includes detecting a preamble within the received digital data sequence.

The disclosure is further directed to a data communication method. The method includes receiving input digital data and encoding the input digital data using a plurality of symbol waveforms. Each of the plurality of symbol waveforms occupies a period of a composite encoded waveform and represents one or more bits of the input digital data. Each symbol waveform of the plurality of symbol waveforms has a positive elliptical segment and a negative elliptical segment. In addition, each symbol waveform is defined so that (i) a zero crossing from the positive elliptical segment to the negative elliptical segment of the symbol waveform is different for each of the plurality of symbol waveforms, and (ii) an energy of the positive elliptical segment of the symbol waveform is substantially equal to an energy of the negative elliptical segment of the symbol waveform. The method further includes generating, using a digital-to-analog converter, an encoded analog waveform from a digital representation of the composite encoded waveform.

In yet another aspect, the disclosure relates to a method of recovering information encoded by symbol waveforms wherein each of the symbol waveforms occupies a period of an encoded composite waveform and includes a positive elliptical segment and a negative elliptical segment of substantially equal energy. The method includes receiving an encoded analog waveform generated using the symbol waveforms and generating digital symbol samples representing the symbol waveforms. The method further includes identifying a first sample of the digital symbol samples corresponding to a transition from ones of the digital signal samples having negative values to ones of the digital signal samples having positive values. The method also includes determining a second sample of the digital signal samples corresponding to a transition from other ones of the digital signal samples having positive values to other ones of the digital signal samples having negative values. The second of the digital samples defines a transition from the positive elliptical segment of one of the symbol waveforms to the negative elliptical segment of the one of the symbol waveforms. The input digital data is then estimated based upon at least the first sample and the second sample.

The disclosure also relates to a system including an input buffer configured to store input digital data and a time domain modulator for encoding the input digital data using a plurality of symbol waveforms. The time domain modulator is configured to effect the encoding so that each of the plurality of symbol waveforms occupies a period of a composite encoded waveform and represents one or more bits of the input digital data. Each symbol waveform of the plurality of symbol waveforms has a positive elliptical segment and a negative elliptical segment. The time domain modulator is further configured to define each symbol waveform so that (i) a zero crossing from the positive elliptical segment to the negative elliptical segment of the symbol waveform is different for each of the plurality of symbol waveforms, and (ii) an energy of the positive elliptical segment of the symbol waveform is substantially equal to an energy of the negative elliptical segment of the symbol waveform. The system also includes one or more digital-to-analog converters for generating an encoded analog waveform from a digital representation of the composite encoded waveform.

In another aspect, the disclosure pertains to a method which involves receiving input digital data and encoding the input digital data in a waveform wherein one or more bit values of the input digital data are encoded within each period of the waveform. The method includes generating, using a digital-to-analog converter, an encoded analog waveform from a digital representation of the periodic waveform wherein the encoded analog waveform is of a frequency f and a power P. The method is further characterized in that any signal of frequency f' resulting from the encoding is of a power P' at least 50 dB less than power P, where f' is offset from f by more than 25 Hz.

The encoding operation may include modulating a sinusoidal waveform at selected phase angles within a period of the sinusoidal waveform. In addition, the modulating may include selectively reducing a power of the sinusoidal waveform at ones of the selected phase angles in accordance with the one or more bit values of the input digital data. The modulating may further include selectively reducing a power of the sinusoidal waveform at a first phase angle of the selected phase angles and a second phase angle of the selected phase angles accordance with the one or more bit values of the input digital data wherein the first phase angle and the second phase angle are separated by approximately 180 degrees.

The disclosure is further directed to a system including an input buffer for storing input digital data and a sub-periodic modulator for encoding the input digital data in a waveform. The sub-periodic modulator is operative to encode one or more bit values of the input digital data within each period of the waveform. The system further includes one or more digital-to-analog converters for generating an encoded analog waveform from a digital representation of the periodic waveform wherein the encoded analog waveform is of a frequency f and a power P. The modulator is configured to effect the encoding such that any signal of frequency f' resulting from the encoding is of a power P' at least 50 dB less than power P, where f' is offset from f by more than 25 Hz.

In yet another aspect the disclosure relates to a method which includes receiving input digital data and encoding the input digital data in a sinusoidal waveform. The encoding is performed by modulating the sinusoidal waveform at selected phase angles within a period of the sinusoidal waveform, thereby creating a modulated sinusoidal waveform. The method further includes generating, using a digital-to-analog converter, an encoded analog waveform from a digital representation of the modulated sinusoidal waveform. The modulating includes forming a first data notch at a first phase angle of the selected phase angles wherein the first data notch includes a first plurality of transition features and subtends a first phase angle range about the first phase angle, the first plurality of transition features being representative of a first plurality of bit values included within the input digital data.

The disclosure is further directed to a system including an input buffer for storing input digital data and a sub-periodic modulator for encoding the input digital data in a sinusoidal waveform. The sub-periodic modulator is configured to perform the encoding by modulating the sinusoidal waveform at selected phase angles within a period of the sinusoidal waveform, thereby creating a modulated sinusoidal waveform. The system also includes one or more digital-to-analog converters for generating an encoded analog waveform from a digital representation of the modulated sinusoidal waveform. The sub-periodic modulator is configured to form a first data notch at a first phase angle of the selected phase angles wherein the first data notch includes a first plurality of transition features and subtends a first phase angle range about the first phase angle, the first plurality of transition features being representative of a first plurality of bit values included within the input digital data.

In another form of the present disclosure, a data communication system is disclosed which comprises a transmitter for receiving a symbol and for generating a modulated sinusoidal waveform representative of the symbol, circuitry for transmitting the modulated sinusoidal waveform, a receiver for receiving the modulated sinusoidal waveform, and circuitry for converting the modulated sinusoidal waveform into the symbol.

In yet another form of the present disclosure, a data communications system is disclosed which comprises a transmitter for receiving a symbol and for generating a modulated sinusoidal waveform representative of the symbol, the modulated sinusoidal waveform having a first layer of modulation and a second layer of modulation, circuitry for transmitting the modulated sinusoidal waveform, a receiver for receiving the modulated sinusoidal waveform, and circuitry for converting the modulated sinusoidal waveform into the symbol.

In still another form of the present disclosure, a data communications system is disclosed which comprises a transmitter for receiving data and for generating a modulated sinusoidal waveform representative of the data, the modulated sinusoidal waveform having an amplitude with the modulated sinusoidal waveform having a first modulation at a first frequency with the first modulation being a reduction in the power of the modulated sinusoidal waveform at the first frequency, and circuitry for transmitting the modulated sinusoidal waveform, and a receiver for receiving the modulated sinusoidal waveform, and circuitry for converting the modulated sinusoidal waveform into the symbol.

The present disclosure further provides a data communications system with high spectral efficiency that is capable of transmitting a large amount of data over a channel by providing a modulated sinusoidal waveform.

The present disclosure is also directed to a data communications system that provides a sinusoidal waveform that carries information sub-periodic with each sinusoidal wave capable of transporting 2, 4, or more symbols, such as 20 bits per period.

The present disclosure further provides a data communications system in which the amount of information transported is a function of the carrier frequency and modulation points within the period, not the spectrum used.

The present disclosure is also directed to a data communications system in which single or multiple layers of amplitude reductions can be used to increase throughput.

The present disclosure is related to a data communication system in which a modulated sinusoidal waveform is produced having a large of amount of information.

The present disclosure is also directed to a data communication system in which a modulated sinusoidal waveform representative of a signal is produced and transmitted to a receiver in which the receiver is capable of reconstructing the signal from the modulated sinusoidal waveform.

These and other advantages of the present disclosure will become apparent after considering the following detailed specification in conjunction with the accompanying drawings, wherein:

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. Also, common but well-understood elements that are useful or necessary in a commercially feasible embodiment are often not depicted in order to facilitate a less obstructed view of these various embodiments of the present invention. In the drawings, like reference characters generally refer to like features (e.g., functionally similar and/or structurally similar elements).

FIGS. 27A and 27B illustrate sinusoids encoded in an energy-balanced manner using data notches of alternative shapes.

DETAILED DESCRIPTION

Figure 1:
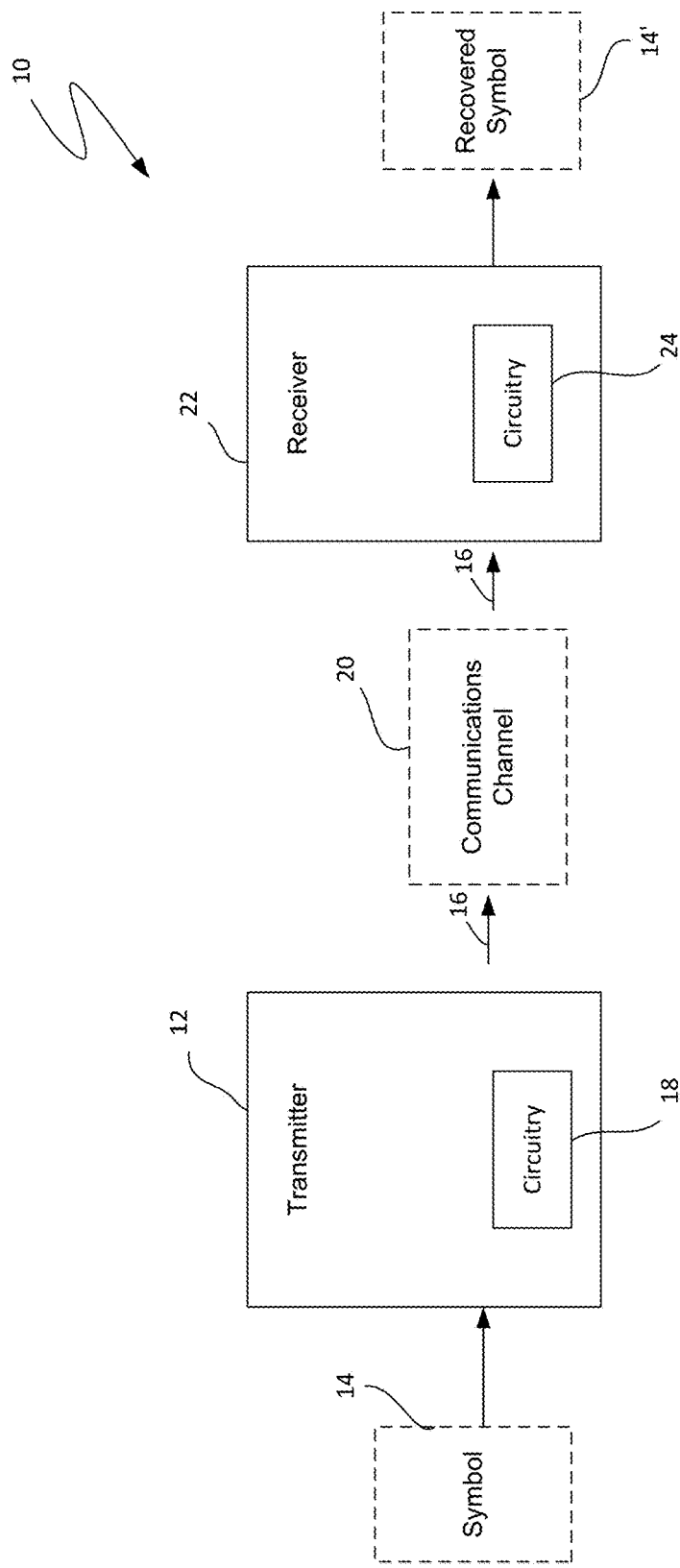
FIG. 1 is a block diagram of a communications system having a transmitter and a receiver constructed in accordance with the present disclosure.

Referring now to the drawings, wherein like numbers refer to like items, number 10 identifies a communications system constructed according to the present disclosure. With reference now to FIG. 1, the data transmission or communications system 10 is shown to comprise a transmitter 12 for receiving a symbol 14 and for generating a modulated sinusoidal waveform 16 representative of the symbol 14, and circuitry 18 for transmitting the modulated sinusoidal waveform 16 over a communications channel 20. The system 10 also comprises a receiver 22 for receiving the modulated sinusoidal waveform 16, and circuitry 24 for converting the modulated sinusoidal waveform into the symbol 14. The communications channel 20 may be provided by media such as coaxial cable, fiber optic cable, telephone or telephone company (telco) lines such as copper wires, open air as by radio frequency or space or satellite. The channel 20 may carry one or many messages. The system 10 will have input data, such as the symbol 14, perform some form of processing of the input data within the transmitter 12 and then transmit the processed data as the signal 16 over the communications channel 20. The receiver 22 is capable of receiving the signal 16 and then performing a converse operation or process to recover the input data or symbol 14 to output the input data or symbol 14 to some other device, such as, by way of example only, a monitor, a computer, an audio component, or a speaker.

Figure 2:
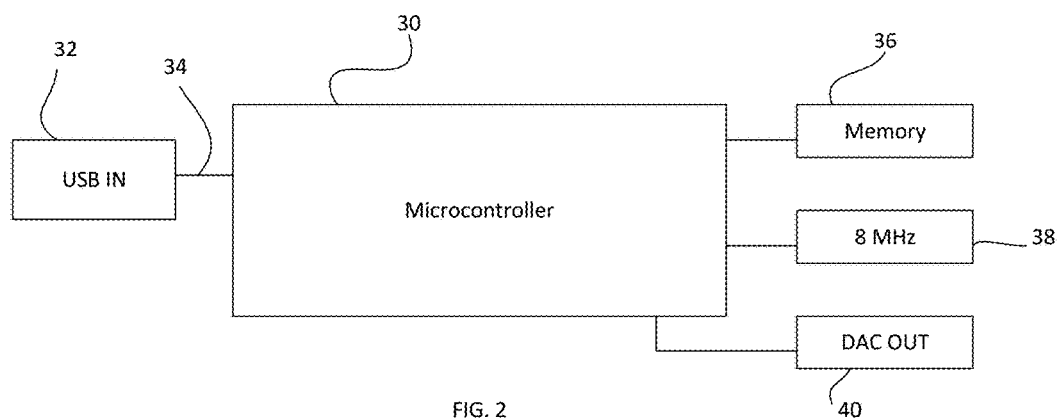
FIG. 2 is a block diagram of an embodiment of the transmitter shown in FIG. 1.

With reference now to FIG. 2, a block diagram of the transmitter 12 is depicted. The transmitter 12 has a microcontroller 30 that has an USB input 32 for receiving the symbol 14 or other input data such as music, video, text, or a combination thereof. The symbol 14 is provided from the USB input 32 to the microcontroller 30 over a connection 34. The microcontroller 30 may also include memory 36, such as a 16 MB memory, an 8 MHz input 38, and a digital-to-analog converter (DAC) output 40. The microcontroller 30 can produce a sine wave or other waveform and a sine table, read in the symbol 14, disassemble the symbol 14, and insert a modulation perturbation or notch in the sine wave or a sinusoidal wave to generate the modulated sinusoidal waveform 16 representative of the symbol 14. The sinusoidal wave may have the modulation perturbation inserted at phase angles of 45°, 135°, 225°, and 315°. As will be explained more fully herein, the inserted modulation perturbation may represent a bit of information. The microcontroller 30 provides the signal 16 to the DAC output 40.

The DAC output 40 may be connected to other circuitry (not shown) that can transmit the signal 16. An example of the microcontroller 30 is a device manufactured by STMicroelectronics known as STM32F756 family of microcontrollers or other similar microcontroller may be used.

Figure 3:
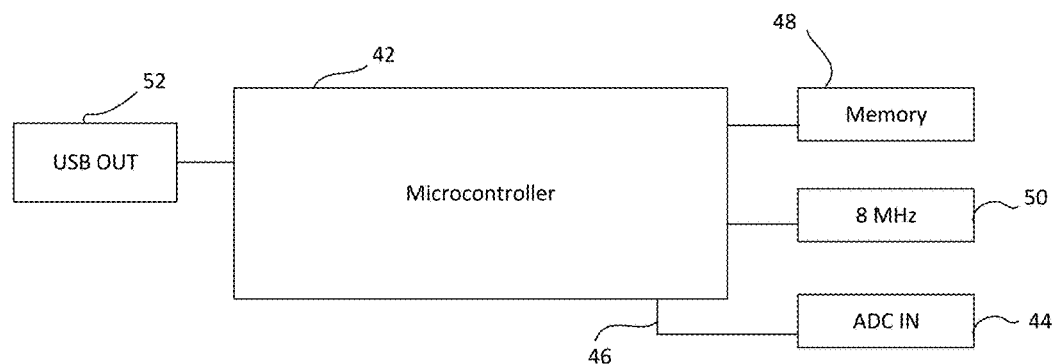
FIG. 3 is a block diagram of an embodiment of the receiver shown in FIG. 1.

FIG. 3 shows a block diagram of the receiver 22 constructed according to the present disclosure. The receiver 22 comprises a microcontroller 42 that has an analog to digital converter (ADC) input 44 for receiving the signal 16 transmitted by the transmitter 12. The signal 16 from the input 44 is provided to the microcontroller 30 over a connection 46. The microcontroller 42 may also include memory 48, such as a 16 MB memory, an 8 MHz input 50, and an RS232 or USB output 52. The output 52 is provided to another device (not shown), such as a speaker. The microcontroller 42 is capable of generating a sine wave and a sine table. The microcontroller 42 also reads in the signal 16 from the ADC input 44, reassembles the symbol 14, and sends the symbol to the output 52 for use by the other device (not shown). Again, an example of the microcontroller 30 is a device manufactured by STMicroelectronics known as STM32F756 family of microcontrollers or other similar microcontroller may be used.

Modulation is commonly understood to be variation of amplitude, frequency, or phase of a carrier wave. The following discloses a new form of modulation that is used by the system 10. This new form of modulation inserts a disturbance, perturbation or notch in a wave such as a sinusoidal wave at multiple phase angles during each period of the wave. The inserted notch has a frequency that is a multiple of the wave frequency. This form of modulation may be termed periodic sine wave modulation. In embodiments in which modulation perturbations of the same type are used at the same phase angles during each wave period, the modulation may be referred to as sub-periodic or intra-periodic sine wave modulation.

Figure 4:
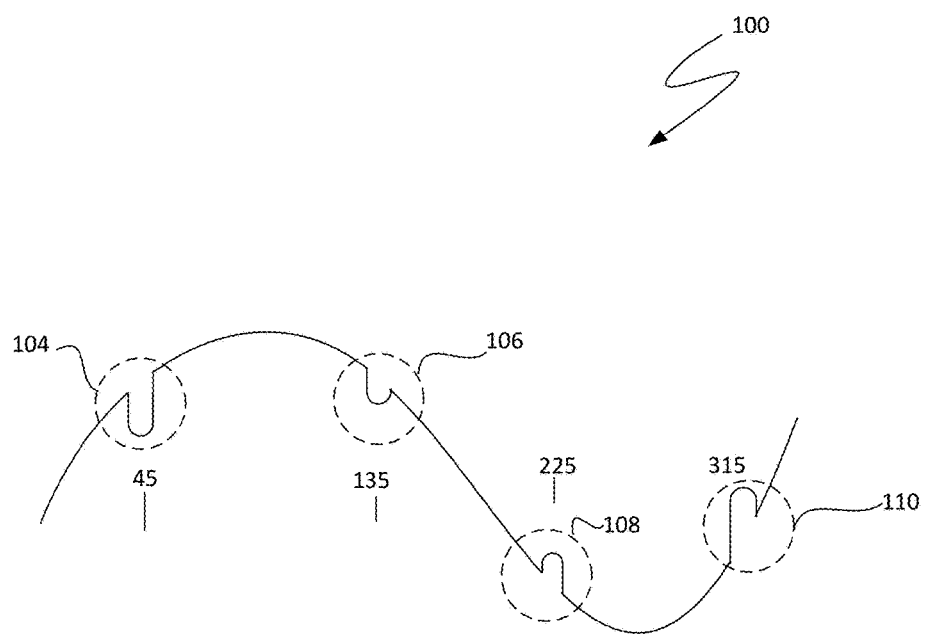
FIG. 4 is a waveform diagram of a modulated sinusoidal waveform that is employed by use of the communication system shown in FIG. 1.

FIG. 4 illustrates an example of one period of a modulated sine wave 100 having a set of four modulation perturbations in the form of notches. As shown, the modulated sine wave 100 corresponds to a sinusoidal wave that is disturbed at a frequency (e.g., 4 times per sine wave period) that is a multiple of the sine wave frequency. In this particular case, the sinusoidal wave is disturbed four times at phase angles of 45°, 135°, 225°, and 315° in order to create a set of four modulation perturbations. As may be appreciated from FIG. 4, the sinusoidal waveform 100 carries information at multiple phase angles within each sinusoidal period, thereby allowing 2, 4, or more symbols to be transmitted during each period. The amount of information conveyed during each period is a function of the carrier frequency and modulation points within the period (not the spectrum used). In this sense the data transmission rate may be characterized in terms of bits per sine wave period rather than in terms of, for example, bits per Hertz.

In one embodiment a digital representation of the modulated sine wave 100 is directly generated as a sequence of voltage points using a software-defined radio (SDR). This sequence of voltage points may then be provided to a digital to analog converter for generation of a corresponding analog version of the modulated sine wave 100. It has been found that in order to minimize the creation of sidebands the modulated sine wave should not exceed the trace or boundaries of an unmodulated sine wave of the same frequency. That is, the modulated sine wave should ideally be of the same frequency and phase as an unmodulated sine wave and have an amplitude magnitude less than that of the unmodulated sine wave at all phase angles. Stated differently, a modulated sine wave may be created by generating an unmodulated sine wave having its output power reduced at or near the phase angles of 45°, 135°, 225° and 315° so as to create a set of modulation perturbations during some or all sine wave periods. The reduction in power associated with generating the modulation perturbations should ideally not exceed a point where a phase shift would be triggered. It has further been found that the creation of sidebands is most favorably minimized when (i) an energy corresponding to the cumulative power reduction occurring over the modulation perturbation at 45° matches an energy corresponding to the cumulative power reduction occurring over the modulation perturbation at 225°, and (ii) an energy corresponding to the cumulative power reduction occurring over the modulation perturbation at 135° matches an energy corresponding to the cumulative power reduction occurring over the modulation perturbation at 315°. As discussed below, single or multiple layers of power reductions can be used to increase throughput.

Figure 5:
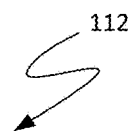
FIG. 5 is a table of notch angles and amplitudes of the modulated sinusoidal waveform shown in FIG. 4.

With reference now to FIG. 5, a table 112 showing the location of the notches on the modulated sine wave 100 shown in FIG. 4 is presented. From a review of the table 112 it should be noted that a notch may be multi valued. In particular, the power of the notch 104 present at 45° is 30% less than the wave power and has a value of 1. The power of the notch 106 present at 135° is 15% less than the wave power and has a value of 0. The power of the notch 108 present at 225° is 15% less than the wave power and has a value of 0. Lastly, the power of the notch 110 present at 315° degrees is 30% less than of the wave power and has a value of 1. While the number of notches may vary, in the embodiment of FIG. 4 the number of notches used is four. As may be appreciated from FIGS. 4 and 5, the modulated sine wave 100 is capable of providing at least four data bits per wave. These four notches may represent four data bits such that, for example, a wave frequency of 400 MHz provides for a 1.6 gigabit data stream.

Figure 6:
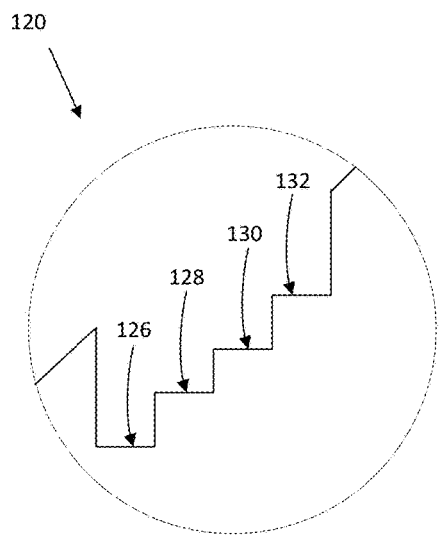
FIGS. 6-9 illustrate exemplary modulation perturbations which each define a plurality of step transitions for encoding multiple data bits.

FIG. 6 illustrates another form of a modulation perturbation 120 which may be utilized to encode data proximate the 45° phase angle. As shown, the modulation perturbation 120 defines a plurality of transitions in the form of steps 126, 128, 130, and 132. In the example of FIG. 6 these plurality of transitions 126, 128, 130, and 132 present a value of 1111 that may be transmitted as part of the modulation perturbation 120.

Figure 7:
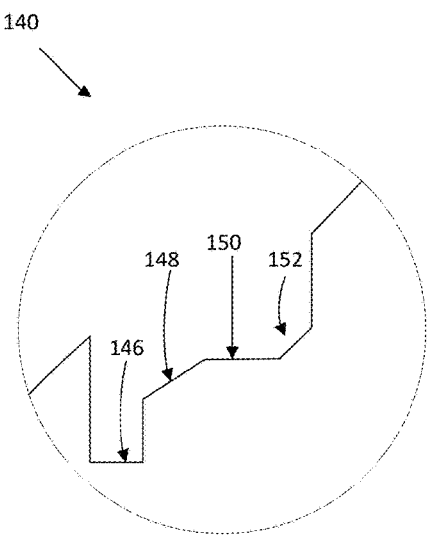

Referring now to FIG. 7, another exemplary modulation perturbation 140 which may be utilized to, for example, encode data proximate a phase angle of 135° is shown. As shown, the modulation perturbation 140 defines a plurality of transitions in the form of steps 146, 148, 150, and 152 to present a value of 1010 that is conveyed when the modulation perturbation 140 is transmitted.

Figure 8:
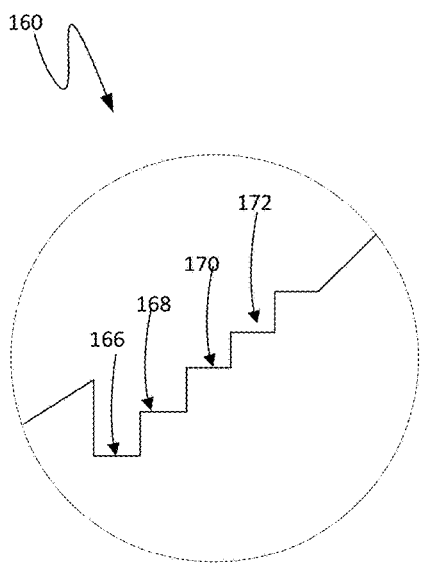

FIG. 8 depicts an exemplary modulation perturbation 160 which may be utilized to, for example, encode data proximate a phase angle of 225°. As shown, the modulation perturbation 160 defines a plurality of transitions in the form of steps 166, 168, 170, and 172. In one embodiment these transitions 166, 168, 170, and 172 are representative of a value of 1111 that is conveyed when the modulation perturbation 160 is transmitted.

Figure 9:
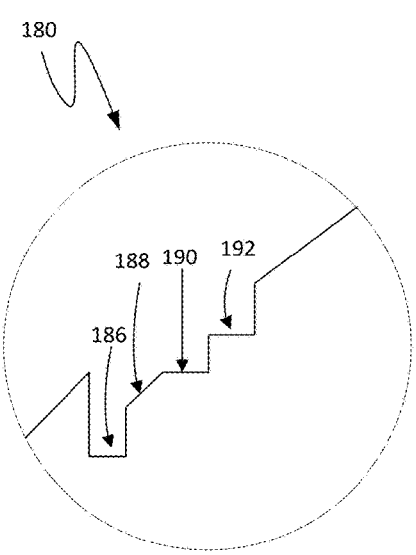

Turning now to FIG. 9, an illustration is provided of an exemplary modulation perturbation 180 which may be utilized to, for example, encode data proximate a phase angle of 315°. The modulation perturbation 180 defines a plurality of transitions in the form of steps 186, 188, 190, and 192. In one embodiment these transitions 186, 188, 190, and 192 are representative of a value of 1011.

As can be appreciated, a relatively higher number of data bits per sine wave period may be transmitted by the system 10 by using modulation perturbations having a plurality of transitions to modulate the amplitude of a sine wave. As discussed above, each of the modulation perturbations 120, 140, 160 and 180 may represent multiple bits of data rather than a single bit of data.

In the embodiments of FIGS. 6-9, it has been found that the creation of sidebands is most favorably minimized when (i) an energy corresponding to the cumulative power reduction occurring over the multi-bit modulation perturbation at 45° matches an energy corresponding to the cumulative power reduction occurring over the multi-bit modulation perturbation at 225°, and (ii) an energy corresponding to the cumulative power reduction occurring over the multi-bit modulation perturbation at 135° matches an energy corresponding to the cumulative power reduction occurring over the multi-bit modulation perturbation at 315°. In this sense power reduction refers to the extent to which the power of an unmodulated sine wave is reduced at a given phase angle in order to define the modulation perturbation at that phase angle. The cumulative power reduction over a modulation perturbation corresponds to the integral over time of the power reductions at the phase angles subtended by the modulation perturbation (e.g., 44.5° to 45.5° for a modulation perturbation at 45°).

Figure 10:
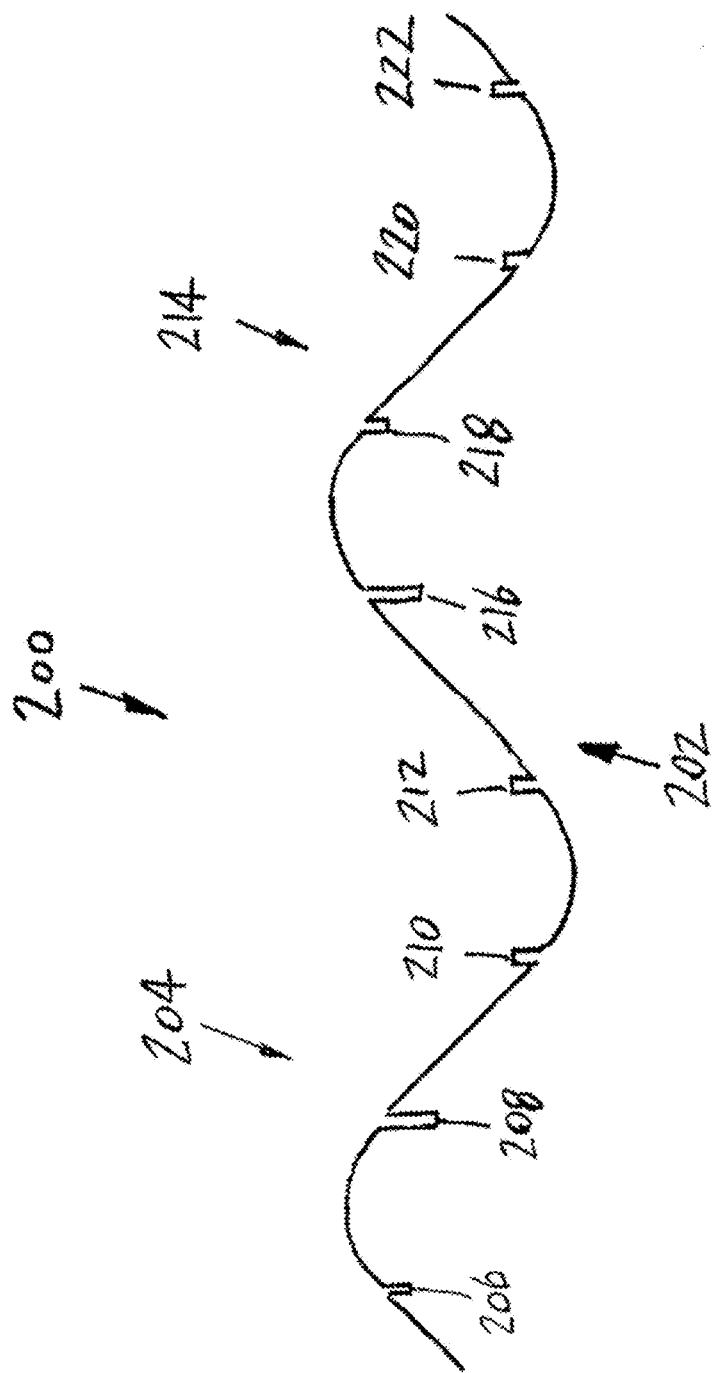
FIG. 10 is a waveform diagram of a modulated sinusoidal waveform representing the letter H.

With particular reference now to FIG. 10, an example of a modulated sinusoidal waveform 200 is shown in which the letter H is shown encoded into the modulated sinusoidal waveform 200 for transmission by the system 10. By way of example only, the letter H may be transmitted in the following manner. The letter H in ASCII (American Standard Code for Information Interchange) code is defined as 01001000. As can be appreciated, in ASCII code there are 8 bits per letter, so it would require two sine waves periods (4 bits per sine wave period) per letter to transmit the letter H when single-bit modulation perturbations (FIGS. 4 and 5) are utilized. The modulated sinusoidal waveform 200 consists of a sinusoidal wave 202 having a first wave or period 204. The sinusoidal wave 202 is disturbed or notched at a first angle 206 of 45° in which the power of the sinusoidal wave 202 is reduced by 15%. In the embodiment of FIG. 10 this degree of power reduction relative to an unmodulated sine wave represents a zero or 0 bit. The sinusoidal wave 202 is also disturbed or notched at a second angle 208 of 135° in which the power of the sinusoidal wave 202 is reduced by 30%. In the embodiment of FIG. 10 this degree of power reduction relative to an unmodulated sine wave represents a one or 1 bit. Next, during the first period 204, the sinusoidal wave 202 is disturbed or notched at a third angle 210 of 225°, in which the power of the wave 202 is reduced by 15% in order to represent a 0 bit. The sinusoidal wave 202 is disturbed or notched at a fourth angle 212 of 315° in which the power of the wave 202 is reduced by 15% to represent a 0 bit. The power reductions of 15% and 30% are merely exemplary and in other embodiments other combinations of power reductions may be utilized.

As shown in FIG. 10, the sinusoidal wave 202 has a second wave period 214. In the second wave period 214 the sinusoidal wave 202 is disturbed or notched at a first angle 216 of 45° in which the power of the wave 202 is reduced by 30%. Again, this modulation perturbation is representative of a 1 bit. The sinusoidal wave 202 is then disturbed or notched at a second angle 218 of 135° in which the power of the wave 202 is reduced by 15% to correspond to a 0 bit. Next, during the second period 214, the sinusoidal wave 202 is disturbed or notched at a third angle 220 of 225° in which a modulation perturbation is created by reducing the power of the wave 202 by 15% relative to an unmodulated sinusoid. This is symbolic of a 0 bit being transmitted. Lastly, the sinusoidal wave 202 is disturbed or notched at a fourth angle 222 of 315° in which the power of the wave 202 is reduced by 15% relative to an unmodulated sinusoid. In the embodiment of FIG. 10, two waves or periods 204 and 214 (4 bits per wave or period) were used to transmit the letter H in ASCII code.

Figure 11:
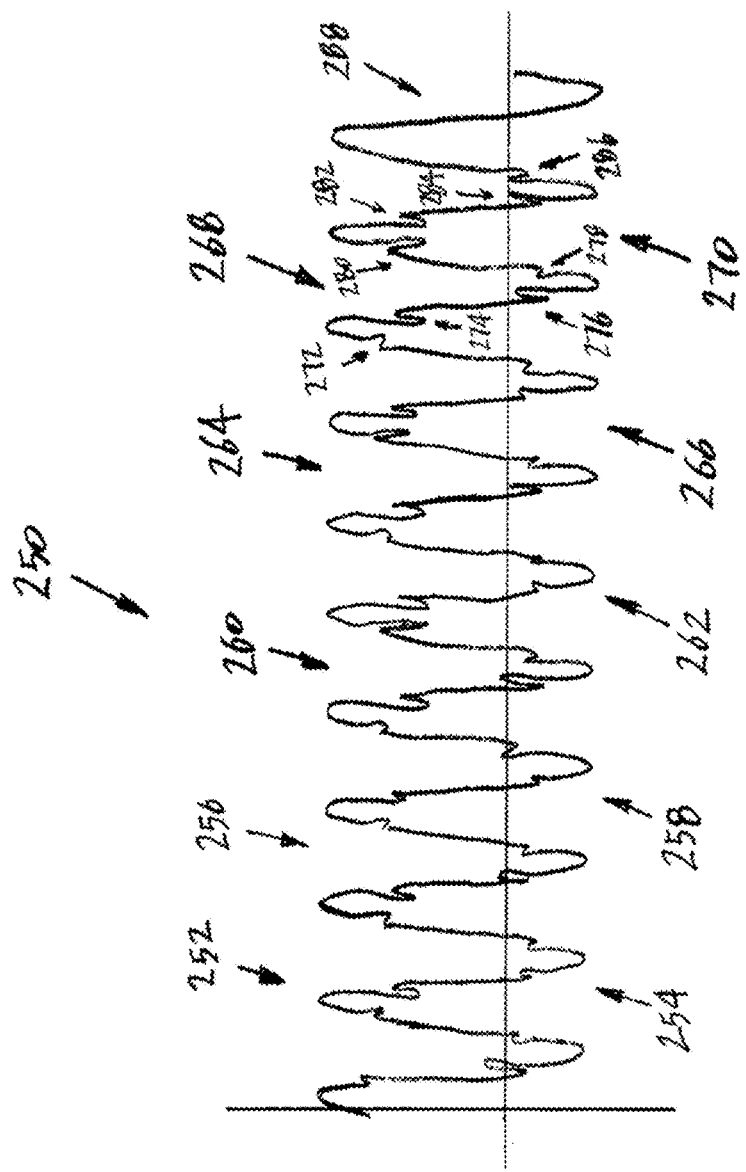
FIG. 11 is a waveform diagram of a modulated sinusoidal waveform representing the word HELLO.

FIG. 11 illustrates an example of a modulated sinusoidal waveform 250 in which the word HELLO is shown encoded into the modulated sinusoidal waveform 250 for transmission by the system 10. The word HELLO may be transmitted in the following manner. By use of ASCII code, the letter H is defined as 01001000, the letter E is defined as 01100101, the letter L is defined as 01101100, and the letter O is defined as 01101111. In order to transmit the word HELLO, only ten waves or sine wave periods would be required when using single-bit modulation perturbations (FIGS. 4 and 5). In embodiments utilizing multi-bit modulation perturbations (FIGS. 6-9), even fewer sine wave periods would be required to transmit the word HELLO.

As may be appreciated, there are 8 bits per letter in ASCII code and so it would require two sine wave periods (4 bits per period) per letter to transmit the word HELLO by use of a sine wave that is modulated using single-bit modulation perturbations. The bit pattern for the word HELLO that appears in FIG. 11 should be transmitted by the system 10 is presented as follows: 0100100001100101011011000110110001101111. As can be appreciated, the modulated sine wave 250 consists of ten periods 252, 254, 256, 258, 260, 262, 264, 266, 268, and 270. In the first period 252 and the second period 254 the letter H is presented. The periods 252 and 254 correspond to the periods 204 and 214 shown in FIG. 10. The periods 256 and 258 are representative of the letter E. The periods 260 and 262 represent the first letter L and the periods 264 and 266 represent the second letter L. Finally, the periods 268 and 270 represent the letter O. By way of example only, in the periods 268 and 270, the bit pattern 01101111 is being transmitted. In particular, the period 268 has a first notch 272 at an angle of 45° in which the power of the wave 250 is reduced by 15%, a second notch 274 at an angle of 135° in which the power of the wave 250 is reduced by 30%, a third notch 276 at an angle of 225° in which the power of the wave 250 is reduced by 30%, and a fourth notch 278 at an angle of 315° in which the power of the wave 250 is reduced by 15%. The period 270 has a first notch 280 at an angle of 45° in which the power of the wave 250 is reduced by 30%, a second notch 282 at an angle of 135° in which the power of the wave 250 is reduced by 30%, a third notch 284 at an angle of 225° in which the power of the wave 250 is reduced by 30%, and a fourth notch 286 at an angle of 315° in which the power of the wave 250 is reduced by 30%. The wave 250 may have another period 288 in which a parity bit or an error detection code is incorporated into the wave 250.

Although in the embodiments of FIGS. 10 and 11 data is encoded by modulation perturbations in the form of notches at phase angles of 45°, 135°, 225° and 315° during each sine wave period, other notch permutations are possible provided that the energy associated with notches in opposite IQ quadrants remains balanced. For example, during certain sine wave periods no notches may be present. During other periods notches may be presently only at, for example, phase angles of 45° and 225°. Alternatively notches may be present only at phase angles of 135° and 315°. Moreover, the power reductions corresponding to notches representing a data value of "0" and a data value of "1" need not be only 15% and 30%, respectively. Other combinations of power reductions may be utilized to create notches representing data of "0" and "1" values in other embodiments.

It has been found that the modulated sine waves described herein may be digitally generated in such a way so as to substantially avoid the creation of harmonics and sidebands. This is believed to be a significant departure from the prior art, in which conventional modulation of sinusoids induces the creation of harmonics and sidebands. Such conventional techniques then typically require that either the sinusoidal carrier or the sidebands be suppressed or otherwise filtered.

In contrast the bandwidth occupied by a modulated sine wave generated consistent with the energy balancing principles described herein can become vanishingly small and be dependent only upon the accuracy of the equipment used (e.g., on the phase noise and jitter of such equipment). That is, it has been found that the disclosed periodic modulation techniques may be implemented such that the bandwidth of the resulting modulated sine wave is essentially independent of the applied energy-balanced modulation. Stated differently, under ideal conditions the energy-balanced modulation does not appear to contribute to the bandwidth of the resulting-modulated sine wave. As a consequence, extremely efficient use of spectrum may be achieved since adjacent modulated sinusoids may be spaced extremely closely (e.g., at spacings of 10 Hz to 15 Hz, or even closer).

The use of this extremely narrow band signal also allows an extremely high sensitivity, as there is almost no noise in this narrow band and only 4 (out of 360) phase angle positions per period are relevant for demodulation. The improvement in sensitivity is therefore caused both by a very narrow channel and a limited use of the signal in the time domain. In general, the sensitivity of the receiver has been found to be commensurate with the sampling rate of the A/D converter.

As noted above, it has been found that in order to substantially avoid the creation of side bands and harmonics when implementing sub-periodic sine wave modulation, the integral of the reduction of the output power at the modulation points which are opposite of each other in an I/Q diagram are required to be substantially equal.

Figures 12A, 12B:
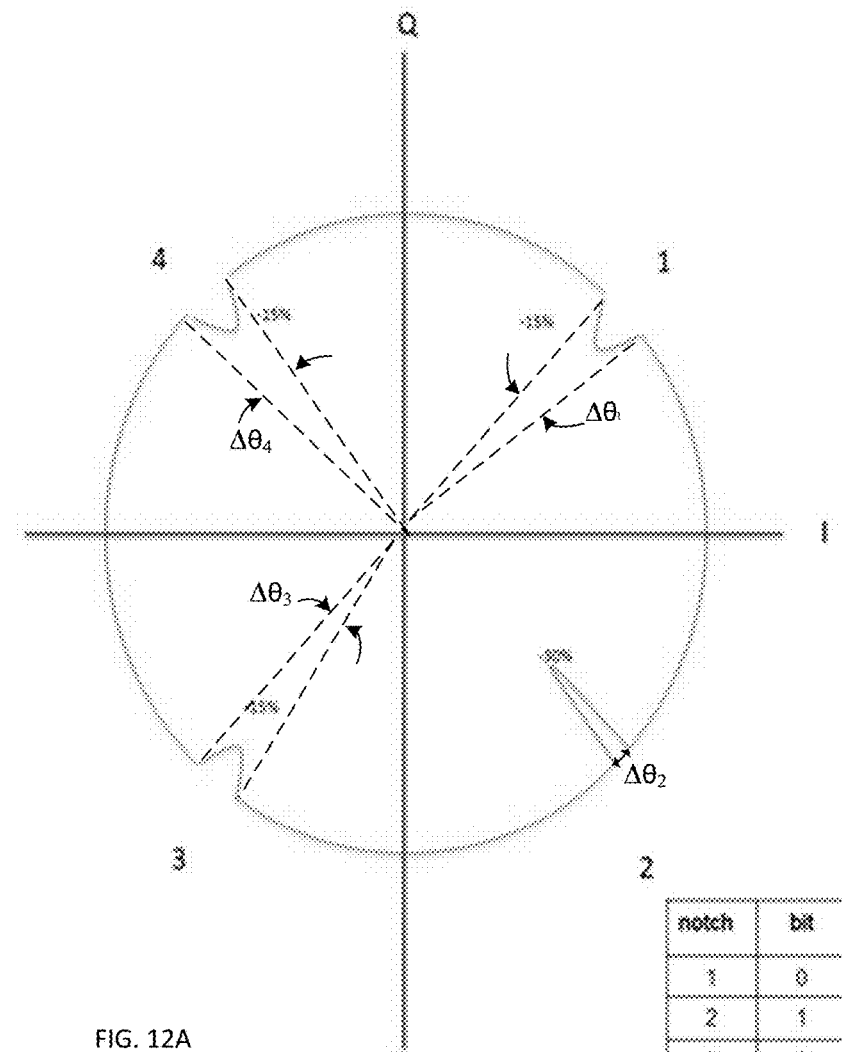
FIGS. 12A and 12B illustrate application of the inventive energy-balancing principle to the case in which each modulation perturbation is representative of a single data bit.

FIGS. 12A and 12B illustrate the manner in which this energy-balancing principle is applied to the case in which each modulation perturbation is representative of a single data bit (4 data bits per sine wave period are encoded). This is achieved by reducing the time (or angle) of the output power of a 30% reduction (representative of a first data value, e.g., a "1") to about half of the time (or angle) of a 15% power reduction (representative of a second data value, e.g., a "0"). The edges where the pure oscillator sine wave enters the power reduced modulation point and where it renters it after the modulation point should ideally be smoothed out.

In the embodiment of FIGS. 12A and 12B, the data values of 0, 0, 0 and 1 are encoded by modulation perturbations created at the phase angles 45°, 135°, 225° and 315°, respectively. In this embodiment, the integral in the reduction of the output power relative to an unmodulated sinusoid arising from the modulation perturbation at 45° is substantially equal to the integral of the reduction of the output power relative to an unmodulated sinusoid arising from the modulation perturbation at 225°. Similarly, the integral in the reduction of the output power relative to an unmodulated sinusoid arising from the modulation perturbation at 135° is substantially equal to the integral of the reduction of the output power relative to an unmodulated sinusoid arising from the modulation perturbation at 315°.

In FIG. 12A, a first modulation perturbation (1) is at a phase angle $\Theta_1$ of 45° and subtends an angle $\Delta\Theta_1$ of approximately 1° between 44.5° and 45.5° (not shown to scale). A second modulation perturbation (2) is at a phase angle $\Theta_2$ of 315° and subtends an angle $\Delta\Theta_2$ of approximately 0.5° between 314.5° to 315.5°. A third modulation perturbation (3) is at a phase angle $\Theta_3$ of 225° and subtends an angle $\Delta\Theta_3$ of approximately 1° between 224.5° and 225.5°. A fourth modulation perturbation (4) is at a phase angle $\Theta_4$ of 135° and subtends an angle $\Delta\Theta_4$ of approximately 1° between 134.5° and 135.5°. In order to achieve energy balancing of the energies associated with modulation perturbations at 45° and at 225°, and energy balancing of the energies associated with modulation perturbations at 135° and at 315°, values of the modulated sinusoid defining transitions into and out of the modulation perturbations may be modified. Alternatively or in addition, the angles subtended by the modulation perturbations may be modified in order to achieve such energy balancing.

In certain embodiments data may not be encoded at each of the four phase angles identified in FIG. 12; that is, at 45°, 135°, 225° and 315°. However, to preserve energy balance an energy-balancing power reduction is made to occur at each phase angle in the IQ diagram opposite a phase angle at which a modulation perturbation is used to encode data. For example, if a modulation perturbation is used to encode one or more data values proximate a phase angle of 45°, then an energy reduction equivalent to the energy associated with the modulation perturbation at 45° is made to occur by disturbing the sinusoid with an energy-balancing perturbation proximate a phase angle of 225°. In one embodiment this energy balancing is achieved by simply replicating the modulation perturbation used at 45° with an identical energy-balancing perturbation at 225°.

Figure 13:
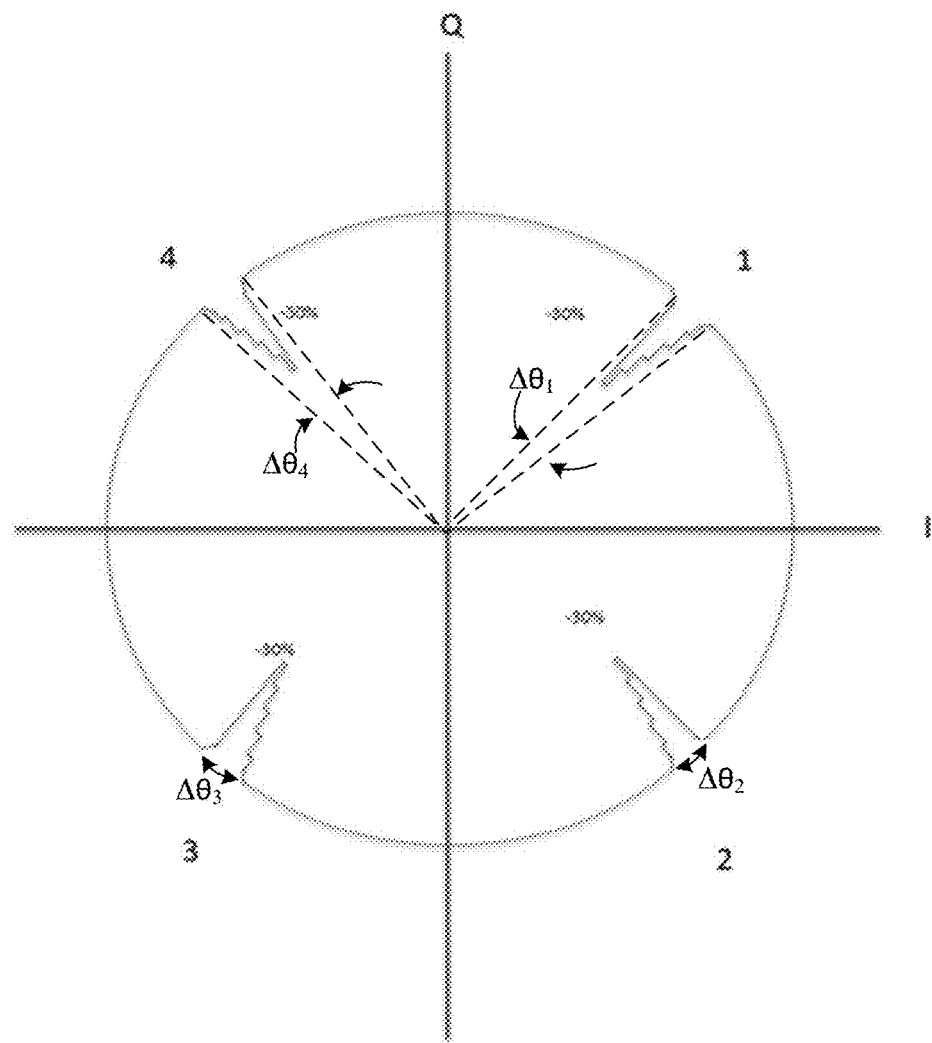
FIG. 13 is an IQ diagram for an energy-balanced modulated sine wave in which each modulation perturbation is representative of five data bits.

Attention is now directed to FIG. 13, which is an IQ diagram for an energy-balanced modulated sine wave in which each modulation perturbation is representative of five data bits (20 data bits per sine wave period). Although in the embodiment of FIG. 13 each modulation perturbation represents five bits of an input data stream, in other embodiments each modulation perturbation may include a greater or fewer number of transitions in order to represent a greater or fewer number of data bits, respectively. In the embodiment of FIG. 13, the minimum power level within the notch created by each modulation perturbation is 30% less than the power of an unmodulated sinusoid which would otherwise exist at the same phase angle in the absence of the modulation perturbation. Rather than encoding data bits by varying such a reduction in power level between two predefined values (e.g., between 15% and 30%), in the embodiment of FIG. 13 data is encoded based upon the steepness and/or number of the transitions defined by each modulation perturbation.

In order to preserve energy balance in the modulated sine wave of FIG. 13, the modulation perturbations which are 180 degrees apart in the IQ diagram are constructed to define step transitions on opposite sides of the notches respectively defined by such modulation perturbations. For example, at phase angle "1" in FIG. 13 a steep power reduction of 30% (other percentages are possible) is defined by an initial portion of the notch (left side of the notch) and step transitions encoding input data bits are defined on a return path to the original 100% power point (right side of the notch). In order to maintain energy balance, this process is reversed at phase angle "3". At this phase angle the step transitions encoding input data bits are performed first (left side of the notch defined by the modulation perturbation at phase angle "3") and the steep and substantially linear back to 100% power is performed second (right side of the notch). The same process is applied with respect to the paired modulation perturbations at the phase angles "2" and "4", respectively.

Each modulation perturbation illustrated in FIG. 13 subtends a phase angle of approximately 1°, although in other embodiments and/or to achieve energy balancing each modulation perturbation may subtend phase angles larger or smaller than 1°. In FIG. 13, a first modulation perturbation (1) is at a phase angle $\Theta_1$ of 45° and subtends an angle $\Delta\Theta_1$ of approximately 1° between 44.5° and 45.5° (not shown to scale). A second modulation perturbation (2) is at a phase angle $\Theta_2$ of 315° and subtends an angle $\Delta\Theta_2$ of approximately 1° between 314.5° to 315.5°. A third modulation perturbation (3) is at a phase angle $\Theta_3$ of 225° and subtends an angle $\Delta\Theta_3$ of approximately 1° between 224.5° and 225.5°. A fourth modulation perturbation (4) is at a phase angle $\Theta_4$ of 135° and subtends an angle $\Delta\Theta_4$ of approximately 1° between 134.5° and 135.5°. °. In order to achieve energy balancing of the energies associated with modulation perturbations at 45° and at 225°, and energy balancing of the energies associated with modulation perturbations at 135° and at 315°, values of the modulated sinusoid defining transitions into and out of the modulation perturbations may be modified. Alternatively or in addition, the angles subtended by the modulation perturbations may be modified in order to achieve such energy balancing.

In the embodiment of FIG. 13, the integral in the reduction of the output power of the modulated sinusoid across the phase angle of 1° subtended by the first modulation perturbation (1) is substantially equal to the integral of the reduction of the output power of the modulated sinusoid across the phase angle of 1° subtended by the third modulation perturbation (3). Similarly, the integral in the reduction of the output power of the modulated sinusoid across the phase angle of 1° subtended by the second modulation perturbation (2) is substantially equal to the integral of the reduction of the output power of the modulated sinusoid across the phase angle of 1° subtended by the fourth modulation perturbation (4).

In one embodiment the integral in the reduction of the output power of the modulated sinusoid over each 0.1° subtended by the first modulation perturbation (1) is substantially equal to the integral of the reduction of the output power of the modulated sinusoid over each corresponding 0.1° subtended by the third modulation perturbation (3). Similarly, in this embodiment the integral in the reduction of the output power of the modulated sinusoid over each 0.1° subtended by the second modulation perturbation (2) is substantially equal to the integral of the reduction of the output power of the modulated sinusoid over each corresponding 0.1° subtended by the fourth modulation perturbation (4).

Although FIG. 13 depicts modulation perturbations having a particular number of step transitions, in other embodiments modulation perturbations having differing numbers or shapes of such transitions or other gradations may be utilized provided that energy balance is maintained among such perturbations in accordance with the teachings herein. For example, in the embodiment of FIG. 13 the modulation perturbations in diagonally opposite quadrants of the IQ diagram each include a matching number of transitions but such transitions are arranged on opposite sides of the notches defined by the perturbations. In other embodiments the modulation perturbations in diagonally opposite quadrants of the IQ diagram may include differing numbers of transitions. Moreover, although in FIG. 13 the modulation perturbations include transitions on either the upslope or downslope of their respective notches, in other embodiments transitions or other gradations may be included on both the upslope and the downslope of one or more of the notches.

As may be appreciated by reference to FIGS. 4 and 10-13, only a relatively small portion of each modulated sine wave is used to actually encode information. Specifically, only the data portions of each modulated sine wave defining modulation perturbations are involved in representing or otherwise encoding data. The remainder of each modulated sine wave may therefore considered to be redundant and of lesser importance, since this redundant sine wave portion does not itself function to encode or represent data.

It has been recognized that the redundant nature of the portions of each modulated sine wave outside of the modulation perturbations can be exploited to increase spectral efficiency. For example, since only a small part of each modulated sine wave is used to represent data, it has been found that multiple modulated sine waves may occupy the same frequency if they are appropriately separated in phase so that their respective modulation perturbations do not overlap.

Figure 14:
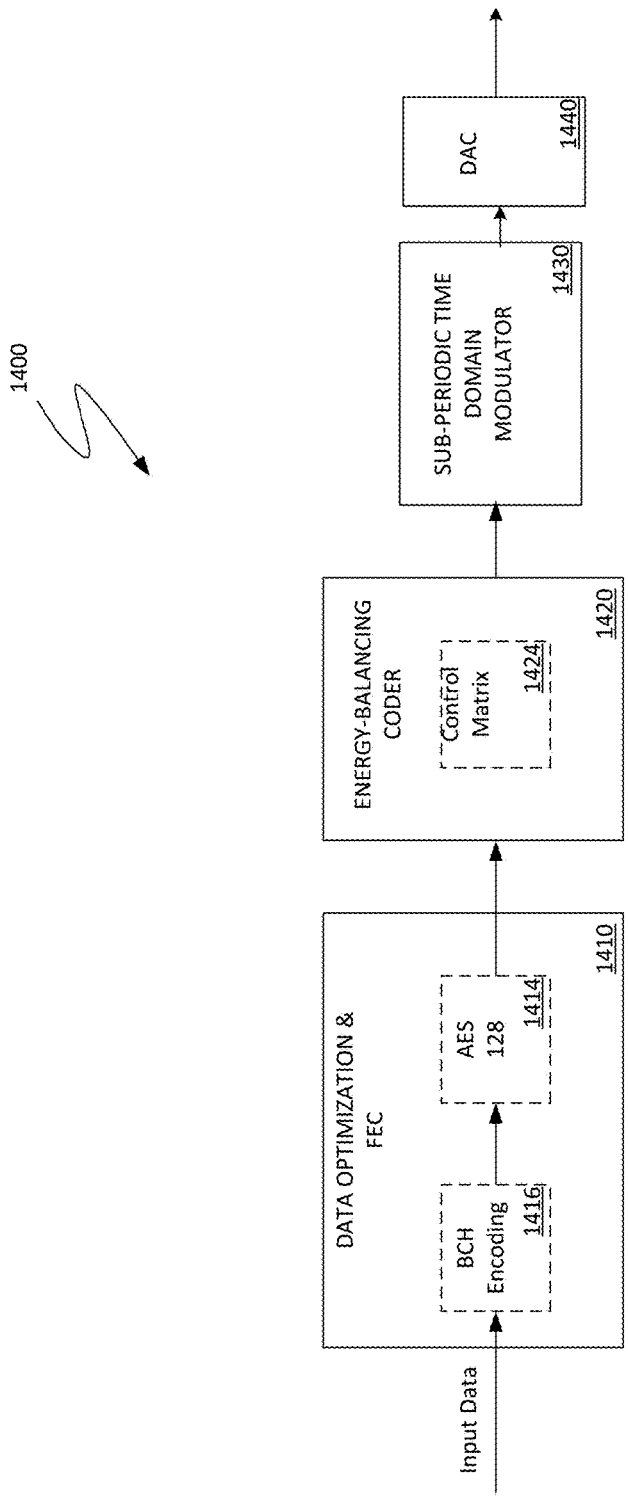
FIG. 14 is a block diagram of an energy-balancing coder/modulator in accordance with the disclosure.

Attention is now directed to FIG. 14, which is a block diagram of an energy-balancing transmitter 1400 in accordance with the disclosure. As shown, the transmitter 1400 includes a data optimization and forward error correction (FEC) module 1410, an energy balancing coder 1420, a sub-periodic time domain modulator 1430 and a digital to analog converter 1440. The data optimization and FEC module 1410 may include, for example, a BCH encoding unit 1416 to which the input data is provided and an AES 128 module 1414. The BCH block 1416 facilitates detection in the receiver by pre-processing the input data to make the number of "1" values within the data substantially equal to the number of "0" values within the data. The AES 128 unit 1414 also aids in detection in the receiver by processing the BCH-encoded input data to limit the run length of strings of the same data value.

Consistent with the AES 128 protocol, 16 bits of BCH-encoded data from the BCH encoding unit 1416 are provided to the AES 128 module 1414 and processed over multiple rounds in accordance with an encryption key. The AES 128 module 1414 is not intended to encrypt the data, but can be used for encryption. The resulting cypher output produced by the AES 128 module 1414 is then provided to the energy balancing coder 1420.

During operation of the transmitter 1400, the input data buffer is transferred to the AES128 module 1414 and processed in accordance with a known key (e.g., 0x47). Again, in one embodiment the primary task of the AES 128 module 1414 is to achieve a uniform distribution of the bits to prevent a series of 0 bits from following each other. At this point the data produced by the AES 128 module 1414 is then transferred to the energy-balancing coder 1420.

As discussed herein, the energy balancing coder 1420 generates, computes or otherwise defines modulation perturbations at selected sine wave phase angles such that substantially equal energy is associated with modulation perturbations in opposite quadrants of an IQ diagram representative of a modulated sine wave produced by the transmitter 1400. Again, it has been found that such energy balancing essentially inhibits the formation in connection with the sine wave modulation effected by the transmitter 1400. As a consequence, modulated sine waves can be spaced much more closely than is possible using conventional modulation schemes, thereby enabling dramatically higher spectral efficiency to be achieved.

The energy balancing coder 1420 includes a control matrix 1424 which contains the same number of ones (row and column weight) in each row and each column; that is, the control matrix 1424 is a regular matrix. The row weight does not have to correspond to the size of the column weight.

In one embodiment the energy balancing coder 1420 is is configured to encode the sequence provided by the data optimization and FEC module 1410 by creating modulation perturbations at the phase angles 45°, 135°, 225° and 315°, respectively. In this embodiment, the integral in the reduction of the output power relative to an unmodulated sinusoid arising from the modulation perturbation at 45° is substantially equal to the integral of the reduction of the output power relative to an unmodulated sinusoid arising from the modulation perturbation at 225°. Similarly, the integral in the reduction of the output power relative to an unmodulated sinusoid arising from the modulation perturbation at 135° is substantially equal to the integral of the reduction of the output power relative to an unmodulated sinusoid arising from the modulation perturbation at 315°.

Figure 15:
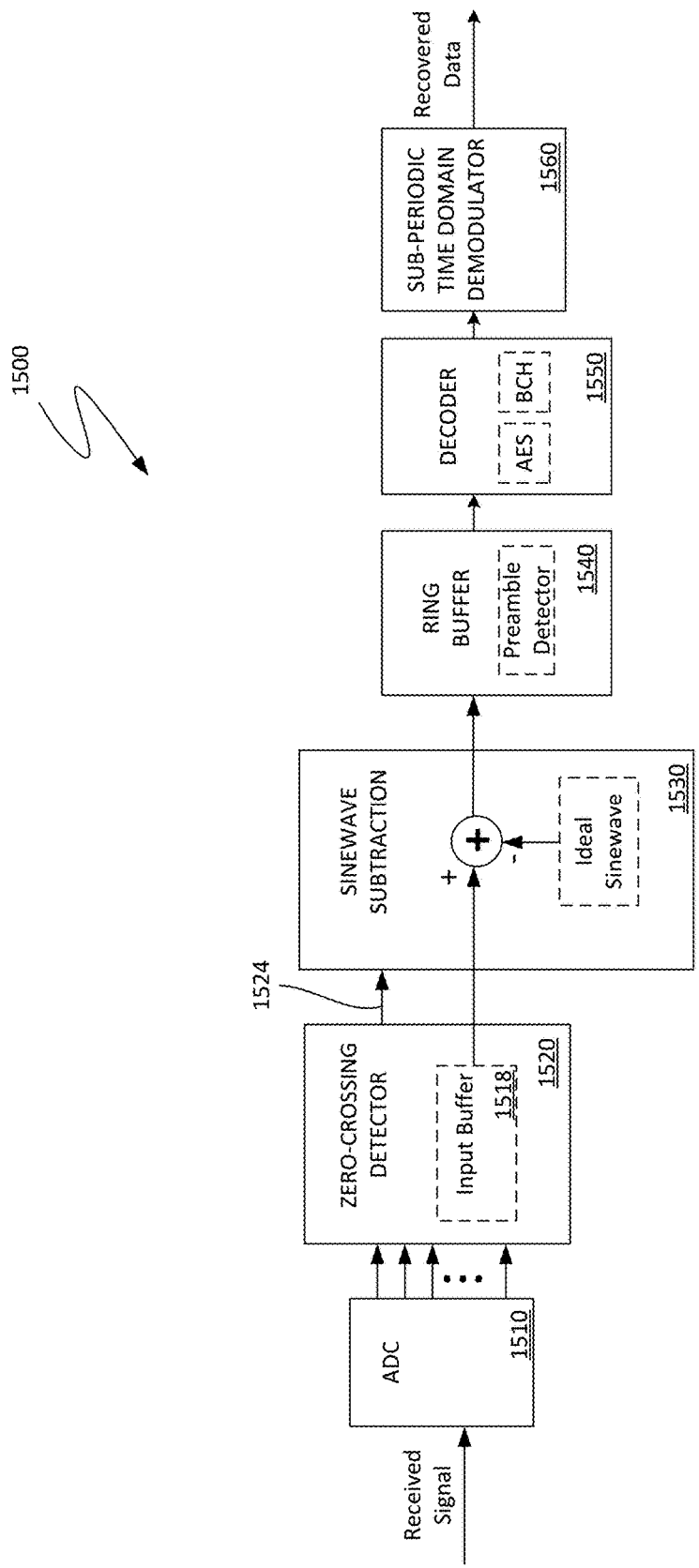
FIG. 15 is a block diagram of a receiver configured to demodulate and decode a modulated sine wave generated by the coder/modulator of FIG. 15.

Attention is now directed to FIG. 15, which is a block diagram of a receiver 1500 configured to demodulate and decode a modulated sine wave generated by, for example, the transmitter 1400. As shown, the receiver 1500 includes an analog to digital converter (ADC) 1510 operative to create a multi-bit representation the received modulated sine wave signal. The digital samples of the received signal are provided to an input buffer 1518 of a zero-crossing detector 1520. Upon detecting a zero crossing within the samples stored within the input buffer 1518, the zero-crossing detector 1520 generates a zero cross detection signal 1524. In response to the zero cross detection signal 1524, a sine wave subtraction circuit 1530 begins a sine wave subtraction process pursuant to which a digital representation of an unmodulated sine wave aligned in phase with the received modulated sine wave signal is subtracted from the digital samples of the modulated sine wave signal. The sequence of digital values resulting from this subtraction process are then stored within a ring buffer 1540 incorporating a preamble detector 1542 configured to detect a preamble inserted into the input data stream provided to the transmitter 1400. Once the preamble has been detected, the received data stream is provided to a decoder 1550 configured to perform the inverse of the operations performed by the AES module 1414 and BCH encoding module 1416. A periodic time domain demodulator 1560 then identifies the modulation perturbations present within the data stream produced by the decoder 1550 and generates a recovered data stream corresponding to an estimate of the input data provided to the transmitter 1400.

Figure 16:
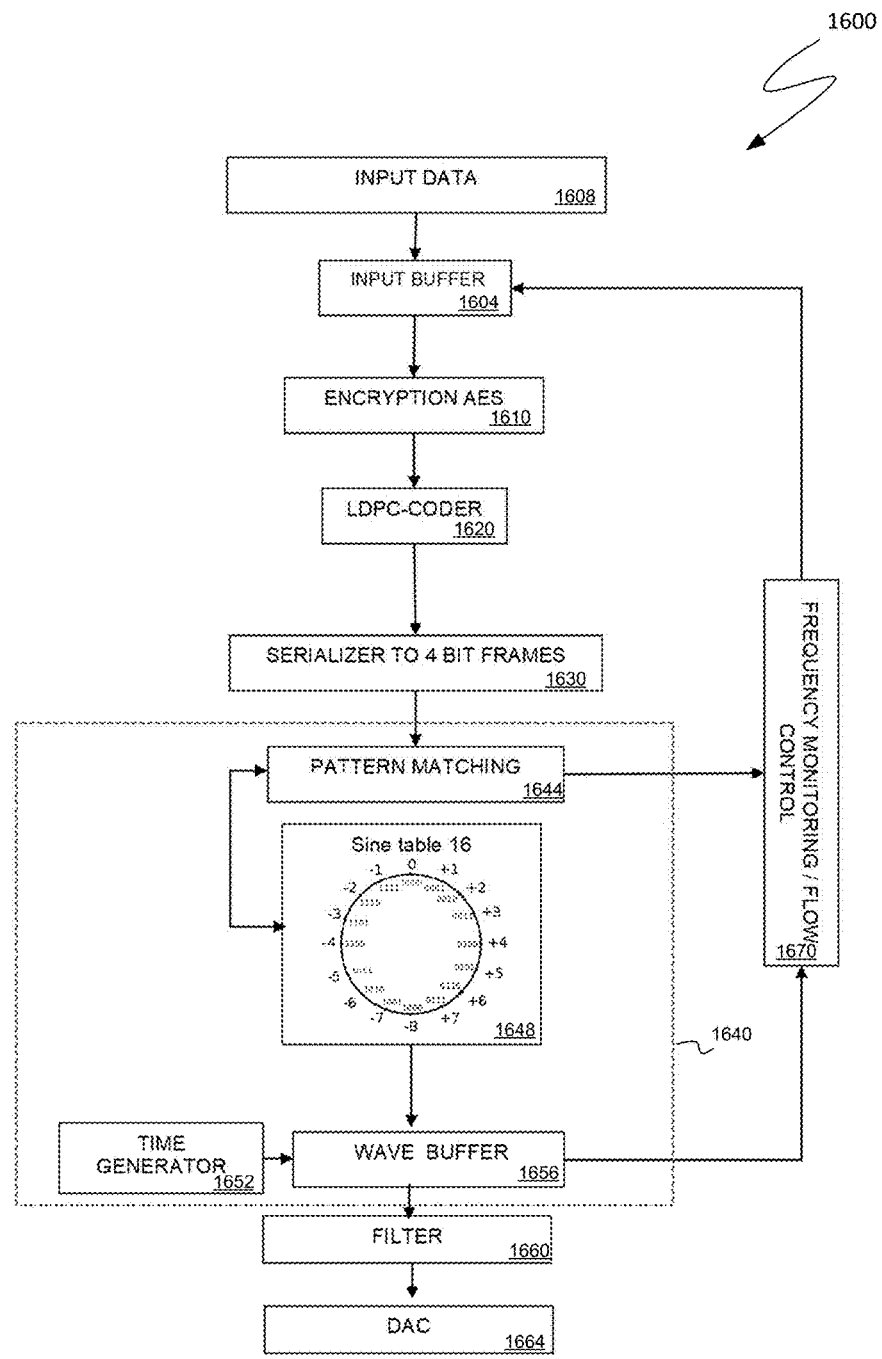
FIG. 16 is a functional block diagram of an embodiment of an energy-balancing transmitter suitable for implementation using a field programmable gate array (FPGA).

Attention is now directed to FIG. 16, which is a functional block diagram of an embodiment of an energy-balancing transmitter 1600 suitable for implementation using a field programmable gate array (FPGA). As shown, the transmitter 1600 includes an input buffer 1604 for storing digital input data 1608, a data optimization unit in the form of an AES encryption module 1610, an LDPC coder 1620 and a serial-to-frame data converter 1630.

A sub-periodic time domain modulator 1640 encodes data frames provided by the data converter 1630 by perturbing sinusoidal waveforms in an energy-balanced fashion. As shown, the sub-periodic time domain modulator 1640 includes a pattern matching unit 1644, a sine wave lookup table 1648, a time generator 1652 and a wave buffer 1656.

The perturbed and energy-balanced waveforms produced by the modulator 1640 are stored in the wave buffer 1656 and optionally pre-distorted or otherwise filtered by a filter 1660 prior to being converted to analog signals by a digital-to-analog converter 1664. The resulting encoded analog signals and transmitted using for example, a transmission line or antenna.

Figure 17:
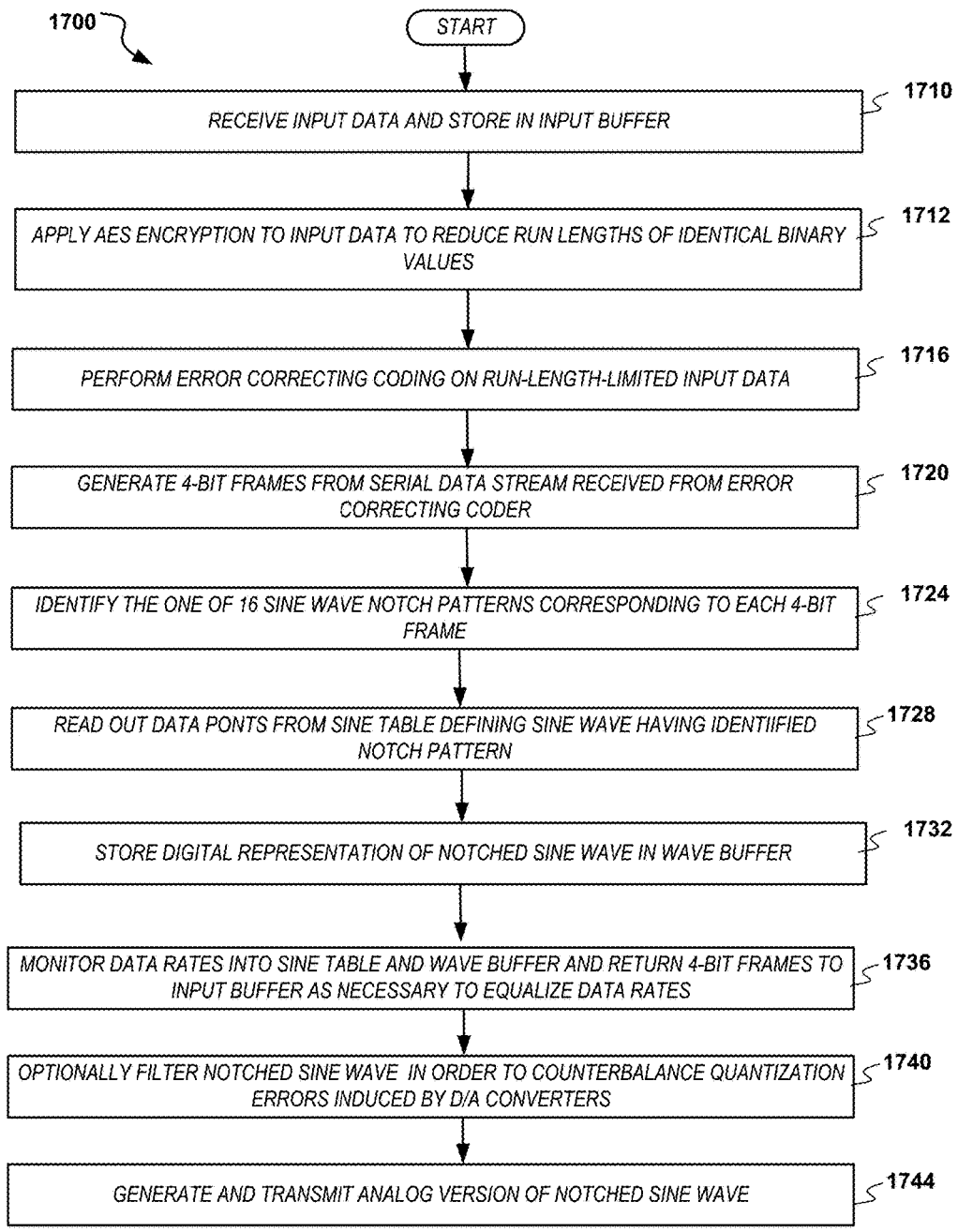
FIG. 17 is a flowchart representative of an exemplary sequence of encoding and other operations performed by an energy balancing transmitter in accordance with an embodiment.

FIG. 17 is a flowchart 1700 representative of an exemplary sequence of encoding and other operations performed by the energy balancing transmitter 1600 in accordance with an embodiment. Once input data has been stored within the input buffer 1604 (stage 1710), it is provided to the AES encryption module 1610. In one embodiment the AES encryption module 1610 aids in detection of the data at a receiver by processing the input data to limit the run length of strings of the same logical value (stage 1712). The resulting output produced by the AES encryption module 1610 is provided to the LDPC coder 1620, which performs low-density parity-check (LDPC) error correcting coding operations (stage 1716). The serial data stream produced by the LDPC coder 1620 is then converted into a sequence of 4-bit data frames by the serial-to-frame data converter 1630 (stage 1720).

The 4-bit data frames produced by the converter 1630 are provided to the pattern matching unit 1644. During operation of the energy balancing transmitter 1600, the pattern matching unit 1644 identifies one of 16 notched sine wave stored within sine wave lookup table 1648 corresponding to the 4-bit data frame currently registered within the pattern matching unit (stage 1724). In one embodiment the sine wave lookup table 1648 stores data values (e.g., 3600 data values) corresponding to a single period of each of 16 notched sine waves having notch patterns corresponding to each of the 16 possible values of the 4-bit data frames provided to the pattern matching unit 1644. The data values defining each successive notched sine wave are then read from the sine wave lookup table 1648 (stage 1728) and stored within the wave buffer 1656 (stage 1732).

In one embodiment each of the 16 notched sine waves stored within the sine wave lookup table 1648 defines modulation perturbations at selected sine wave phase angles such that substantially equal energy is associated with modulation perturbations in opposite quadrants of an IQ diagram. Again, it has been found that such energy balancing essentially inhibits the formation of sidebands in connection with the sine wave modulation effected by the transmitter 1600. As a consequence, modulated sine waves can be spaced much more closely than is possible using conventional modulation schemes, thereby enabling dramatically higher spectral efficiency to be achieved.

In one embodiment the modulation perturbations defined by each of the notched sine waves stored in the sine wave lookup table 1648 are at the phase angles 45°, 135°, 225° and 315°, respectively. In this embodiment, the integral in the reduction of the output power relative to an unmodulated sinusoid arising from the modulation perturbation at 45° is substantially equal to the integral of the reduction of the output power relative to an unmodulated sinusoid arising from the modulation perturbation at 225°. Similarly, the integral in the reduction of the output power relative to an unmodulated sinusoid arising from the modulation perturbation at 135° is substantially equal to the integral of the reduction of the output power relative to an unmodulated sinusoid arising from the modulation perturbation at 315°. In one embodiment a modulation perturbation corresponding to a logical 0 subtends an angle of approximately 1 degree about the selected phase angle and defines an amplitude reduction of approximately 15% relative to an unmodulated sinusoid. In this embodiment a modulation perturbation corresponding to a logical 1 subtends an angle of approximately 0.5 degrees about the selected phase angle and defines an amplitude reduction of approximately 30% relative to an unmodulated sinusoid.

The time generator 1652 provides a clocking signal to the wave buffer 1656 so that a relatively constant data rate is maintained into the filter 1660. Since the data rate of the input data provided to the input buffer 1604 may be somewhat bursty or otherwise irregular, the time generator 1652 functions to essentially remove the resulting jitter from the data stream produced by the sine wave lookup table 1648 before it is provided to the filter 1660.

In one embodiment the transmitter 1600 includes a frequency monitoring/flow control module 1670 operative to control the data rate into the sub-periodic time domain modulator 1640. Specifically, the flow control module 1670 monitors the data rate into the pattern matching unit 1644 and into the wave buffer 1656. When the data rate into the pattern matching unit 1644 begins to exceed the data rate into the wave buffer 1656, the flow control module 1670 sends 4-bit frames from the pattern matching unit 1644 or serial-to-frame data converter 1630 back to the input buffer 1604 until these data rates are equalized (stage 1736).

The digital representations of the notched and energy-balanced sine waves stored within the wave buffer 1656 are optionally pre-distorted or otherwise filtered by the filter 1660 in order to compensate for quantization errors introduced by the digital-to-analog converter 1664 (stage 1740). In one embodiment this filtering may comprise introducing a pre-distortion having a power spectra in the frequency domain equivalent to the power spectra expected to be induced by such quantization errors, phase-shifted by 180 degrees. The filtered digital signal produced by the filter 1660 is then converted to an encoded analog signal by the DAC 1664 and transmitted via either a wired or wireless communication medium (stage 1744).

Figure 18:
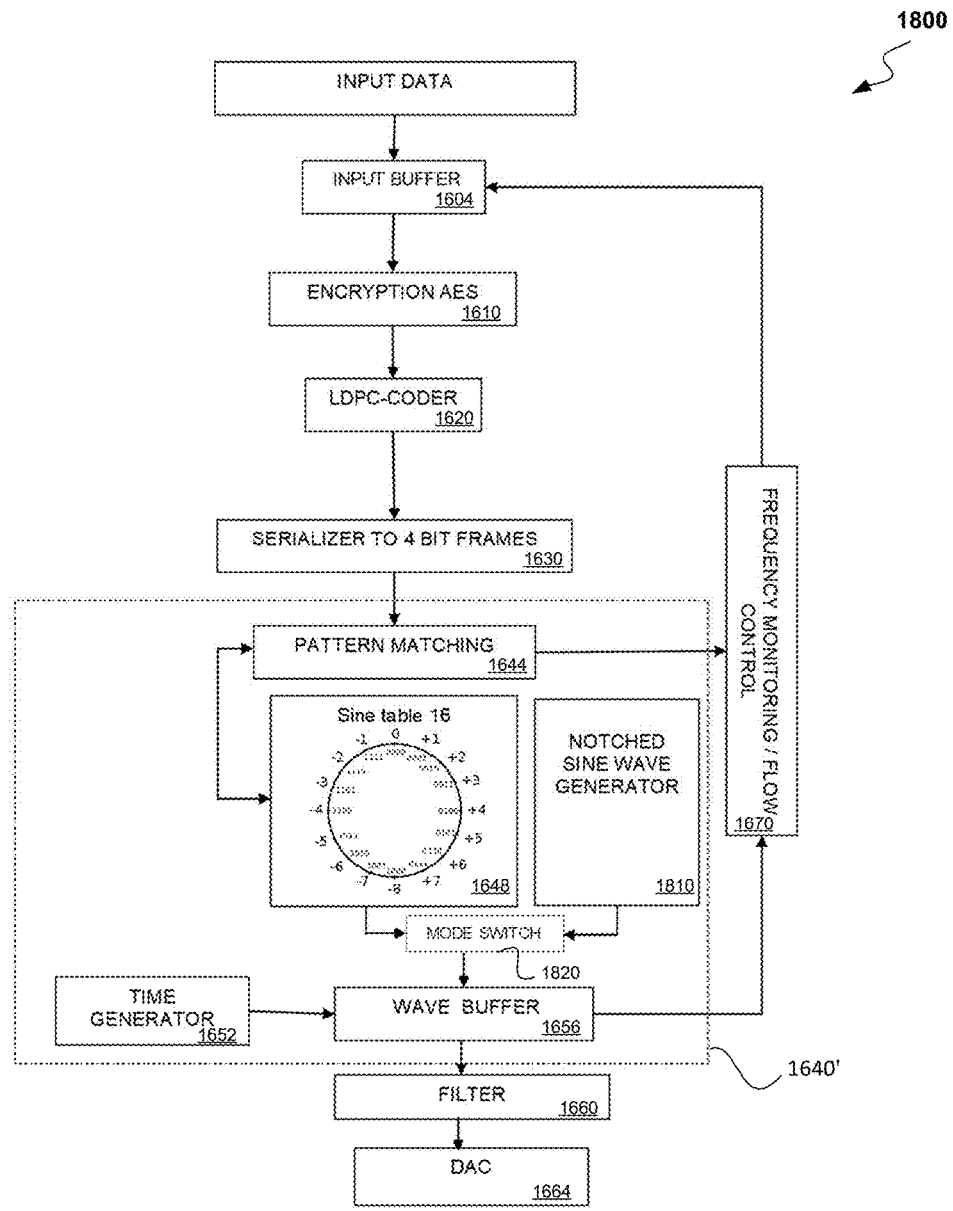
FIG. 18, which is a functional block diagram of an another embodiment of an energy-balancing transmitter suitable in accordance with the disclosure.

Attention is now directed to FIG. 18, which is a functional block diagram of an another embodiment of an energy-balancing transmitter 1800 suitable for implementation in, for example, an FPGA. Except as described below, the structure and function of the transmitter 1800 is substantially identical to the structure and function of the energy-balancing transmitter 1600 of FIG. 16. Accordingly, like reference numerals are used in FIGS. 16 and 18 to identify substantially identical transmitter components. As may be appreciated with respect to FIGS. 16 and 18, the structure of the transmitter 1800 differs from that of the transmitter 1600 in that the time domain modulator 1640 additionally includes a notched sine wave generator 1810 and a mode switch 1820. These additional elements are intended to enable the transmitter 1800 to operate at relatively higher data rates and are discussed below.

Figure 19:
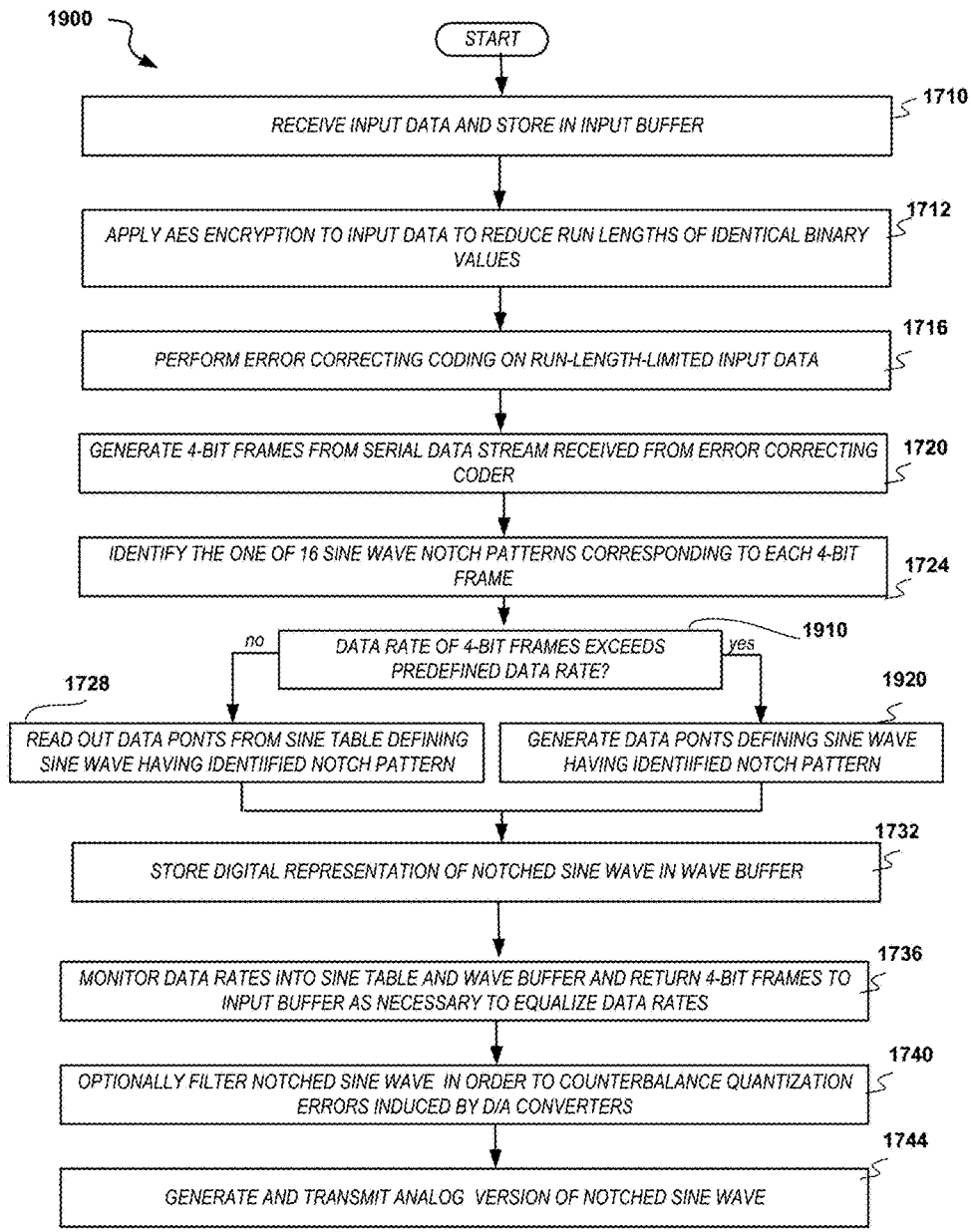
FIG. 19 is a flowchart representative of an exemplary sequence of encoding and other operations performed by the energy balancing transmitter in accordance with an embodiment.

Referring now to FIG. 19, a flowchart 1900 is provided which is representative of an exemplary sequence of encoding and other operations performed by the energy balancing transmitter 1800 in accordance with an embodiment. Given the similarity in the structure and function of the transmitter 1800 and the transmitter 1600 of FIG. 16, like reference numerals are used in the flowcharts of FIGS. 17 and 19 to identify substantially identical operations.

During operation of the transmitter 1800, the sub-periodic time domain modulator 1640' determines whether the data rate of the 4-bit frames provided to the pattern matching unit 1644 exceeds a predefined data rate (stage 1910). At relatively lower data rates, i.e., at data rates less than the predefined data rate known to the modulator 1640', the data points defining the notched sine wave corresponding to the 4-bit frame registered in the pattern matching unit 1644 are read out from the sine wave lookup table 1648 and provided to the wave buffer 1656 via the mode switch 1820 (stage 1728). In one embodiment the predefined data rate is set to the data rate at which the stored data defining the notched sine waves may be read out from the sine table 1648. Because in one embodiment a relatively large number of points (e.g., 3600) are used to define each notched sine wave, at higher data rates the I/O capabilities of certain memory implementations may be insufficient to support desired input data rates. Accordingly, in one embodiment the data points defining the notched sine waves corresponding to the 4-bit frames sequentially registered in the pattern matching unit 1644 are generated "on the fly" by the notched sine wave generator 1810 rather than being read out from the sine table 1648.

In this embodiment the notched sine wave generator 1810 may be configured to generate a set of data points (e.g., 360 data points) for an unmodulated sine wave by simply executing a processing loop which solves the equation for a sine wave at a set of phase angles (e.g., at each of 360 degrees). In this example the 10 or so data points defining the contour of the unmodulated sine wave around each phase angle at which a data notch is to be created (i.e., 45°, 135°, 225° and 315°) are replaced with an equal number of data points defining the notch pattern (e.g., 1,0,1,1) corresponding to the 4-bit data frame registered by the pattern matching unit 1644 (stage 1920). The resulting set of data points (e.g., 360 data points) are then provided to the wave buffer 1656 by the mode switch 1820 (stage 1732). Although this approach offers less resolution in defining the data notch patterns of each notched sine wave relative to the higher-resolution approach in which a large number of data points (e.g. 3600) are pre-stored within the sine table 1648 for each notched sine wave, it enables higher input data rates to be accommodated. The data flow control, filtering and digital-to-analog conversion processes are then performed in the manner described above with reference to FIGS. 16 and 17 once the data points defining each notched sine wave have been placed in the wave buffer 1656.

Alternatively, the notched sine wave generator 1810 may be configured to generate a set of data points (e.g., 360 data points) by executing a processing loop which generates a modulated sine wave having a data notch defining a logical "0" at each of the four phase angles of interest (i.e., 45°, 135°, 225° and 315°). In this example the 10 or so data points about each phase angle of interest would be replaced only if the 4-bit data frame registered by the pattern matching unit 1644 called for a logical "1" at the phase angle of interest. For example, a 40-bit frame of [1,0,0,1] could require that the 10 data points around each of 45° and 315° be replaced with sets of data points defining a logical "1" rather than a logical "0".

It is a feature of the energy balancing techniques described herein that modulation perturbations may be imposed upon a sinusoidal waveform at selected phases without creating sidebands of material power (e.g., 50 dB or more below the power of the sine wave at its carrier frequency). This permits modulated sine waves generated in accordance with the disclosure to be spaced very closely without materially interfering with each other. For example, it has been found that such modulated sine waves may be spaced apart in frequency by less than 15 Hz. This enables a given band of spectrum to be utilized more efficiently than is possible using conventional modulation techniques.

In one embodiment each modulated sine wave carrier within a multi-carrier system is modulated using modulation perturbations of similar type. For example, in one implementation each of the modulated carriers is modulated using modulation perturbations including a number of step transitions (see FIG. 13). In other embodiments each of the modulated carriers is modulated using modulation perturbations comprised of notches representing 1 data bit (see FIG. 10). Although in some embodiments modulated sine waves occupying adjacent frequency slots (e.g., frequencies separated by 15 Hz or less) are generated using modulation perturbations of different types, it has been found that performance is improved if modulation perturbations of the same type are used in generating adjacent modulated sine waves.

Figure 20:
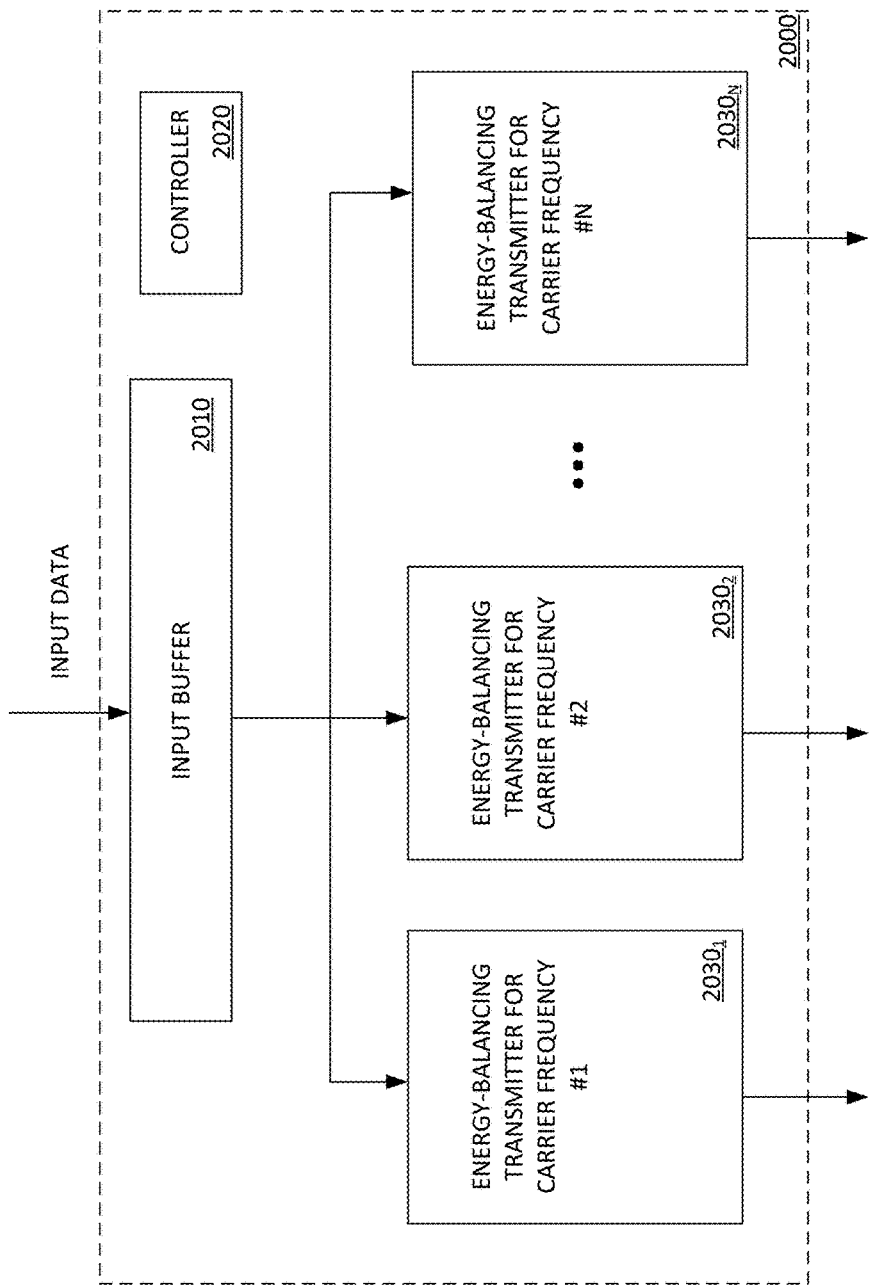
FIG. 20 is a block diagram representation of a multi-carrier energy-balancing transmitter in accordance with an embodiment.

Attention is now directed to FIG. 20, which is a block diagram representation of a multi-carrier energy-balancing transmitter 2000 in accordance with an embodiment. As shown, the transmitter 2000 includes an input buffer 2010 in which input data from an external source is stored. The stored data within the input buffer 2010 is allocated among a plurality (N) of modulated, energy-balanced sine wave carriers by a controller 2020. Specifically, controller 2020 directs streams of input data to a set of N energy-balancing transmitters 2030. Each of the N transmitters 2030 modulates a sine wave carrier in accordance with its stream of input data from the input buffer 2010 so as to produce a modulated, energy-balanced since wave. In one embodiment each of the N transmitters 2030 may be substantially identical to, for example, the energy-balancing transmitter 1600 or the energy-balancing transmitter 1800 and may be implemented as a separate cell of an FPGA.

In one embodiment the controller 2020 routes data from the input buffer 2410 to a first of the transmitters 20301 until the input data rate exceeds the maximum data rate of the first transmitter 20301. At this point the controller may provide data to both the first transmitter 20301 and one or more other of the remaining N−1 transmitters 2030. Other data allocation strategies are possible. For example, a fixed amount of data from the input buffer 2410 may be provided to each of the N transmitters 2030 such that each transmitter 2030 operates a data rate of R/N, where R is the data rate into the input buffer 2410. For example, a first four data bits received by the input buffer could be routed to transmitter 20301, a second four bits received by the input buffer could be routed to transmitter 20302, and so on. If at some point the data rate into the input buffer 2010 exceeded the aggregate data rate of the N transmitters 2030, one or more of the N transmitters 2030 could send back at least some of the 4-bit data frames provided to it for buffering in the input buffer 2010.

Figure 21:
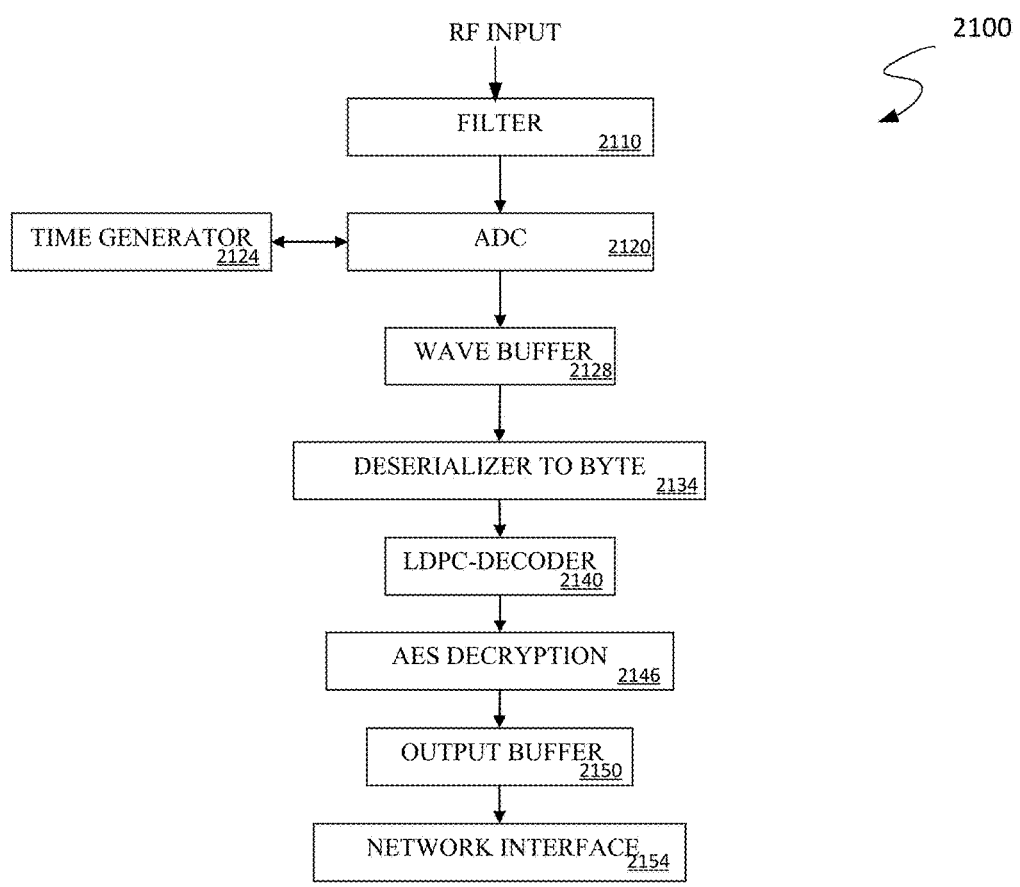
FIG. 21 is a functional block diagram of a receiver configured to receive and demodulate encoded sine waves transmitted by an energy-balancing transmitter configured in accordance with the disclosure.

Attention is now directed to FIG. 21, which is a functional block diagram of a receiver 2100 configured to receive and demodulate encoded sine waves transmitted by an energy-balancing transmitter configured in accordance with the disclosure. For example, the receiver 2100 is capable of receiving and demodulating encoded sine waves transmitted by the energy-balancing transmitter 1600 or the energy-balancing transmitter 1800. As shown, one or more energy-balanced encoded sine waves are received by a filter 2110 of the receiver 2100 and provided to an analog-to-digital converter (ADC) 2120.

A time generator 2124 clocks or otherwise controls the output data rate of the ADC 2120. Amplitude values of each received energy-balanced encoded sine wave generated by the ADC 2120 are provided to a wave buffer 2128. Once the receiver 2100 has achieved time synchronization with a received energy-balanced encoded sine wave (e.g., by detecting zero crossings of the received encoded sine wave), the ADC 2120 may be gated "on" so as to only generated sample values around the data notches of the received encoded sine wave. For example, the ADC 2120 may be turned on only for a time period equivalent to approximately one degree of phase at phase angles of 45°, 135°, 225° and 315°. Thus, in one embodiment sensitivity is enhanced by configuring the ADC 2120 to sample over only a very narrow bandwidth and furthermore by only sampling during approximately 4° of every 360° sine wave period. When energy-balanced encoded sine waves of multiple carrier frequencies are being received, the ADC 2120 may be gated on and off so as to only sample during the 45°, 135°, 225° and 315° phase angles of each encoded sine wave. Alternatively, a separate ADC could be used to sample each encoded sine wave at narrow windows around the 45°, 135°, 225° and 315° phase angles of the encoded sine wave. The signal samples produced by the ADC 2120 are provided to a wave buffer 2128.

The contents of the wave buffer 2128 are serially provided to a deserializer-to-byte unit 2134, which produces a series of logical values representing the bit values encoded by the data notches of the encoded sine wave received by the receiver 2100. The logical values generated by the byte unit 2134 are then provided to an LDPC decoder 2140 configured to remove the LDPC encoding applied by the energy-balancing transmitter (e.g., the transmitter 1600 or transmitter 1800) from which the encoded sine wave was transmitted. Similarly, an AES decryption unit 2146 reverses the encryption applied by a corresponding AES encryption unit in the energy-balancing transmitter. The output of the AES decryption unit 2146 may then be provided to an output buffer 2150. In one embodiment the receiver 2100 searches bit sequences within the output buffer 2150 for a preamble data bit string (e.g., a 0x47 string) signifying the start of a packet. In an exemplary implementation the encoded sine waves received by the receiver 2100 carry frames of 1500 bits. Each frame begins with a predefined bit string (e.g., 0x47) and is followed by the data being communicated. Once the preamble has been identified within the output buffer 2150, an estimate of the data being communicated may be provided to a local area network (LAN) or the like via a network interface 2154. Alternatively, the entire contents of the output buffer 2150 may be provided to an external system configured to identify the preamble for each frame and recover the data conveyed by the frame.

Figure 22:
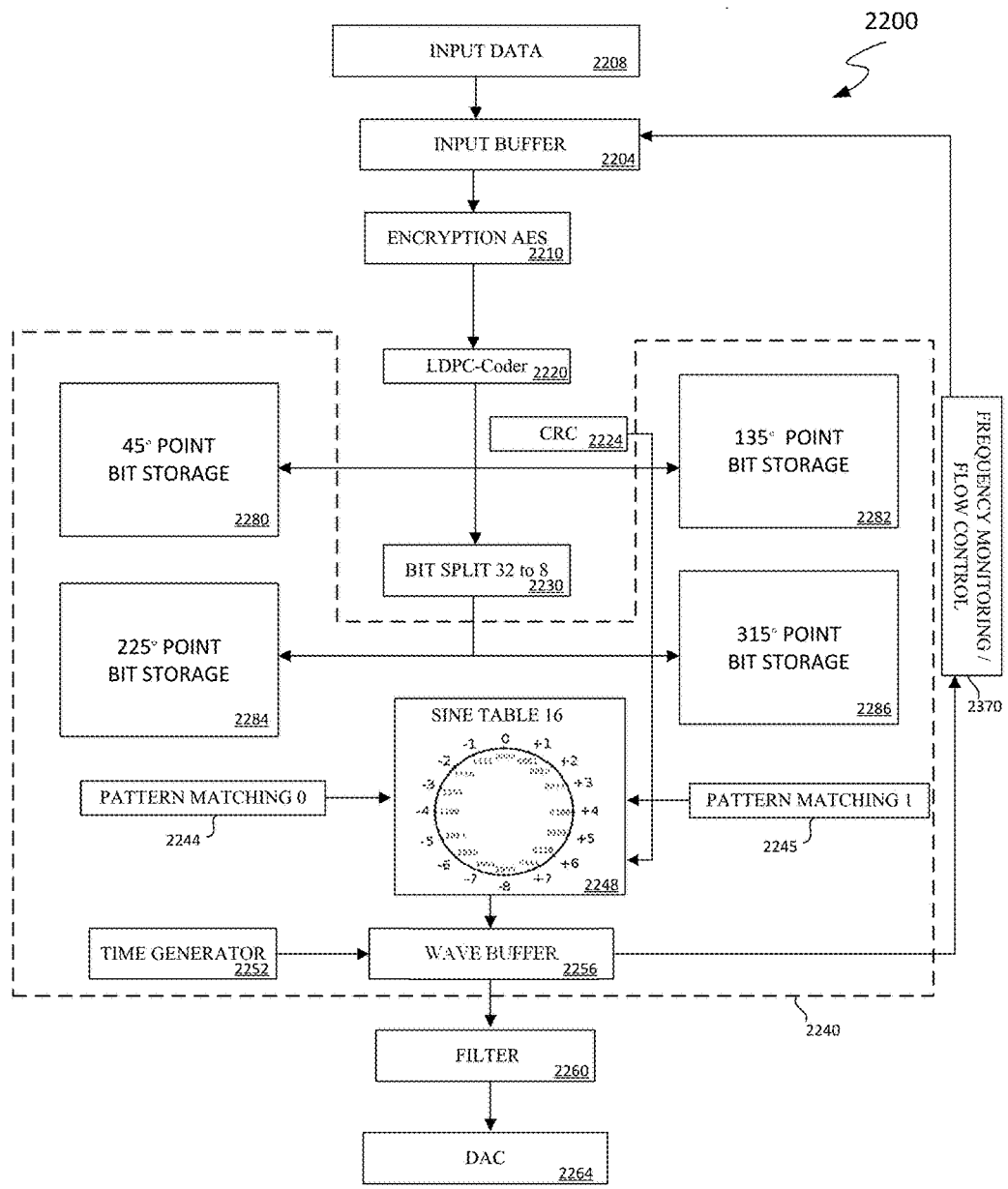
FIG. 22 is a functional block diagram of an embodiment of an energy-balancing transmitter configured to generate and transmit sinusoidal waveforms modulated with multi-bit features at selected phase angles.

Attention is now directed to FIG. 22, which is a functional block diagram of an embodiment of an energy-balancing transmitter 2200 configured to generate and transmit sinusoidal waveforms modulated with multi-bit features at selected phase angles. In one embodiment these multi-bit features include notches having 4-bit stair step patterns of the type illustrated in, for example, FIGS. 6-9. In other embodiments these features may be utilized to encode 8 or more bits at each selected phase angle. The maximum number of bits capable of being encoded at each phase angle is believed to be limited primarily or exclusively by the resolution of the digital-to-analog and analog-to-digital converters within the transmitter 2200 and a corresponding receiver, respectively.

As shown, the transmitter 1600 includes an input buffer 2204 for storing digital input data 2208, a data optimization unit in the form of an AES encryption module 2210, an LDPC coder 2220, a cyclic redundancy check (CRC) module 2224, and a 32-to-8 bit splitter 2230.

A sub-periodic time domain modulator 2240 encodes data frames provided by the bit splitter 2230 by perturbing sinusoidal waveforms in an energy-balanced fashion. As shown, the sub-periodic time domain modulator 2240 includes first and second pattern matching units 2244 and 2245, a sine wave lookup table 2248, a time generator 2252, and a wave buffer 2256. The modulator 2240 further includes memory for storing the sets of data points defining multi-bit data notches for each of the 45°, 135°, 225° and 315° phase angles. In particular, the modulator 2240 includes a 45° storage unit 2280 for storing sets of data points defining multi-bit data notches for the 45° phase angle, a 135° storage unit 2282 for storing sets of data points defining multi-bit data notches for the 135° phase angle, a 225° storage unit 2284 for storing sets of data points defining multi-bit data notches for the 225° phase angle, and a 315° storage unit 2286 for storing sets of data points defining multi-bit data notches for the 315° phase angle. The energy-balanced waveforms having multi-bit data notches produced by the modulator 2240 are stored in the wave buffer 2256 and optionally pre-distorted or otherwise filtered by a filter 2260 prior to being converted to analog signals by a digital-to-analog converter (DAC) 2264. The resulting encoded analog signals and transmitted using for example, a transmission line or antenna.

During operation of the energy-balancing transmitter 2200, input data 2208 stored within the input buffer 2204 is provided to the AES encryption module 2210. In one embodiment the AES encryption module 2210 aids in detection of the data at a receiver by processing the input data to limit the run length of strings of the same logical value. The resulting output produced by the AES encryption module 2210 is provided to the LDPC coder 2220, which performs low-density parity-check (LDPC) error correcting coding operations. The serial data stream produced by the LDPC coder 2220 is then provided to the CRC module 2224 and a bit splitter 2230. In one embodiment in which the multi-bit data notch defined at each of the selected phase angles of the sinusoidal waveforms includes 8 bits (32 bits being encoded per each period of the sinusoidal waveform), the bit splitter 2230 divides the 32 bits for each frame into 4 sets of 8 bits. In this embodiment the bit splitter 2230 causes each of the 4 sets of 8 bits for a given frame to address a different one of the storage units 2280, 2282, 2284 and 2286. In response, each of the storage units 2280, 2282, 2284 and 2286 retrieves from its memory a pre-computed 8-bit, stair step notch pattern corresponding to the 8-bit pattern used to address it and provides the data points defining such a notch pattern to the wave buffer 2256. In this embodiment each of the 8-bit, stair step notch patterns stored by each of the each of the storage units 2280, 2282, 2284 and 2286 is of equal area, i.e., each stored 8-bit, stair step pattern is energy balanced with all other stored patterns.

In another embodiment the encoded sinusoidal waveform stored in the wave buffer 2256 encodes not only a 32-bit data frame (8 bits at each of four phase angles) but also encodes a CRC value produced by the CRC module 2224. In this embodiment the CRC value (e.g., a 4-bit value) is provided to the sine wave lookup table 2248. In this embodiment the sine wave lookup table 2248 defines a set of 16 notches sinusoidal waveforms, where the depth of each data notch at each of the four selected phase angles is defined by one of the 4 bits of the CRC value. For example, a logical 0 in the CRC value corresponds to a data notch subtending an angle of approximately 1 degree about the selected phase angle and defines an amplitude reduction of approximately 15% relative to an unmodulated sinusoid. A logical 1 in the CRC value corresponds to a data notch subtending an angle of approximately 0.5 degrees about the selected phase angle and defines an amplitude reduction of approximately 30% relative to an unmodulated sinusoid. So in substantially the same manner as was described above with reference to FIG. 16, the 4-bit CRC value defines the span and depth of the data notches at the selected phase angles (i.e., 45°, 135°, 225° and 315°). In addition, each of the four 8-bit sets of data within the 32-bit data frame provided to the bit splitter 2230 defines the stair step pattern imposed on the notches at each of the four selected phase angles. Because for energy balancing to occur the areas of the notches (with imposed stair step patterns) at 45° and 225° must be equal and the areas of the notches at 135° and 315° must be equal, the stair step pattern for a given 8-bit portion of the data frame required to achieve such energy balancing may be different depending upon the CRC value. Accordingly, the sine table 2248 selects the data points defining the appropriately energy-balanced stair step patterns from the storage units 2280, 2282, 2284 and 2286 in response to the CRC value from the CRC module 2224 and the 32-bit data frame value produced by the LDPC coder 2220. In one embodiment portions of the 32-bit data frame may be loaded into pattern matching units 2244 and 2245.

The time generator 2252 provides a clocking signal to the wave buffer 2256 so that a relatively constant data rate is maintained into the filter 2260. Since the data rate of the input data provided to the input buffer 2204 may be somewhat bursty or otherwise irregular, the time generator 2252 functions to essentially remove the resulting jitter from the data stream produced by the sine wave lookup table 2248 before it is provided to the filter 2260.

In one embodiment the transmitter 2200 includes a frequency monitoring/flow control module 2270 operative to control the data rate into the sub-periodic time domain modulator 2240. Specifically, the flow control module 2270 monitors the data rate into the modulator 2240 and into the wave buffer 2256. When the data rate into the modulator 2240 begins to exceed the data rate into the wave buffer 2256, the flow control module 2270 sends data from the pattern matching units 2244 and 2245 or bit splitter 2230 back to the input buffer 2204 until these data rates are equalized.

The digital representations of the notched and energy-balanced sine waves stored within the wave buffer 2256 are optionally pre-distorted or otherwise filtered by the filter 2260 in order to compensate for quantization errors introduced by the digital-to-analog converter 2264. In one embodiment this filtering may comprise introducing a pre-distortion having a power spectra in the frequency domain equivalent to the power spectra expected to be induced by such quantization errors, phase-shifted by 180 degrees. The filtered digital signal produced by the filter 2260 is then converted to an encoded analog signal by the DAC 2264 and transmitted via either a wired or wireless communication medium.

Figure 23:
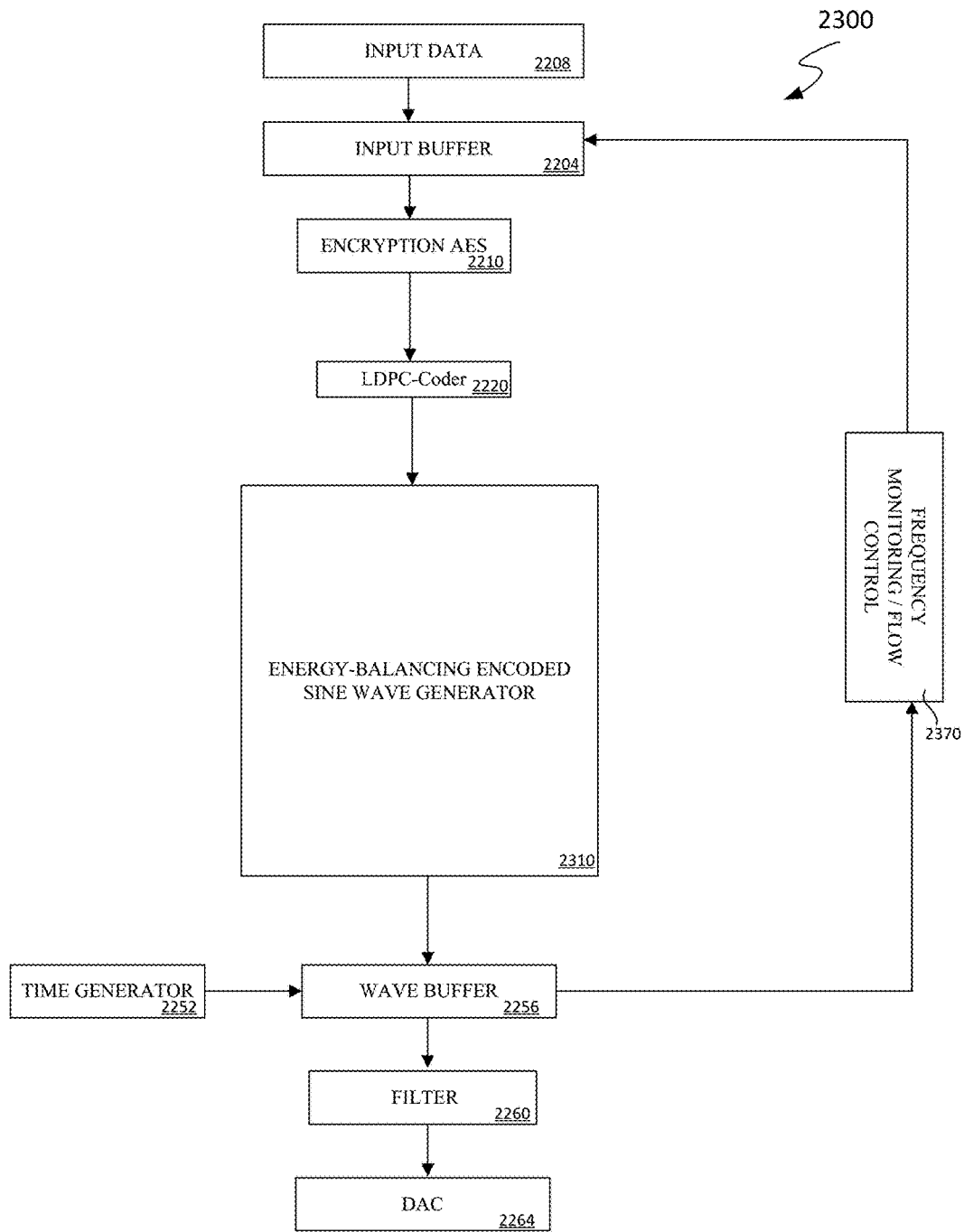
FIG. 23 is a functional block diagram of an another embodiment of an energy-balancing transmitter configured to generate and transmit sinusoidal waveforms modulated with multi-bit features at selected phase angles.

Attention is now directed to FIG. 23, which is a functional block diagram of an another embodiment of an energy-balancing transmitter 2300 configured to generate and transmit sinusoidal waveforms modulated with multi-bit features at selected phase angles. Aspects of the structure and function of the transmitter 2300 are substantially identical to those of the energy-balancing transmitter 2200 of FIG. 22. Accordingly, like reference numerals are used in FIGS. 22 and 23 to identify substantially identical transmitter components. As is discussed below, the transmitter 2300 includes an energy-balancing encoded sine wave generator 2310 configured to enable the transmitter 2300 to selectively operate at relatively higher data rates than the transmitter 2200.

During operation of the transmitter 2300, the energy-balancing encoded sine wave generator 2310 determines whether the data rate out of the LDPC-coder 2220 exceeds a predefined data rate. At data rates below the predefined data rate, the energy-balancing encoded sine wave generator 2310 operates substantially to the sub-periodic time domain modulator 2240 (FIG. 22) to produce sinusoidal waveforms encoded with multi-bit notch features at selected phase angles. That is, the energy-balancing encoded sine wave generator 2310 relies upon pre-stored sets of data points defining energy-balanced data notches and recalls these pre-computed and pre-stored data points in accordance with the input data being encoded. Because in one embodiment a relatively large number of points (e.g., 3600) are used to define each encoded sine wave generated by the modulator 2240, at higher data rates the I/O capabilities of certain memory implementations may be insufficient to support desired input data rates. Accordingly, in the embodiment of FIG. 23 the data points defining the encoded sine waves having multi-bit notch features at selected phase angles are generated "on the fly" by the energy-balancing encoded sine wave generator 2310 rather than being retrieved from pre-populated data tables.

Figure 24:
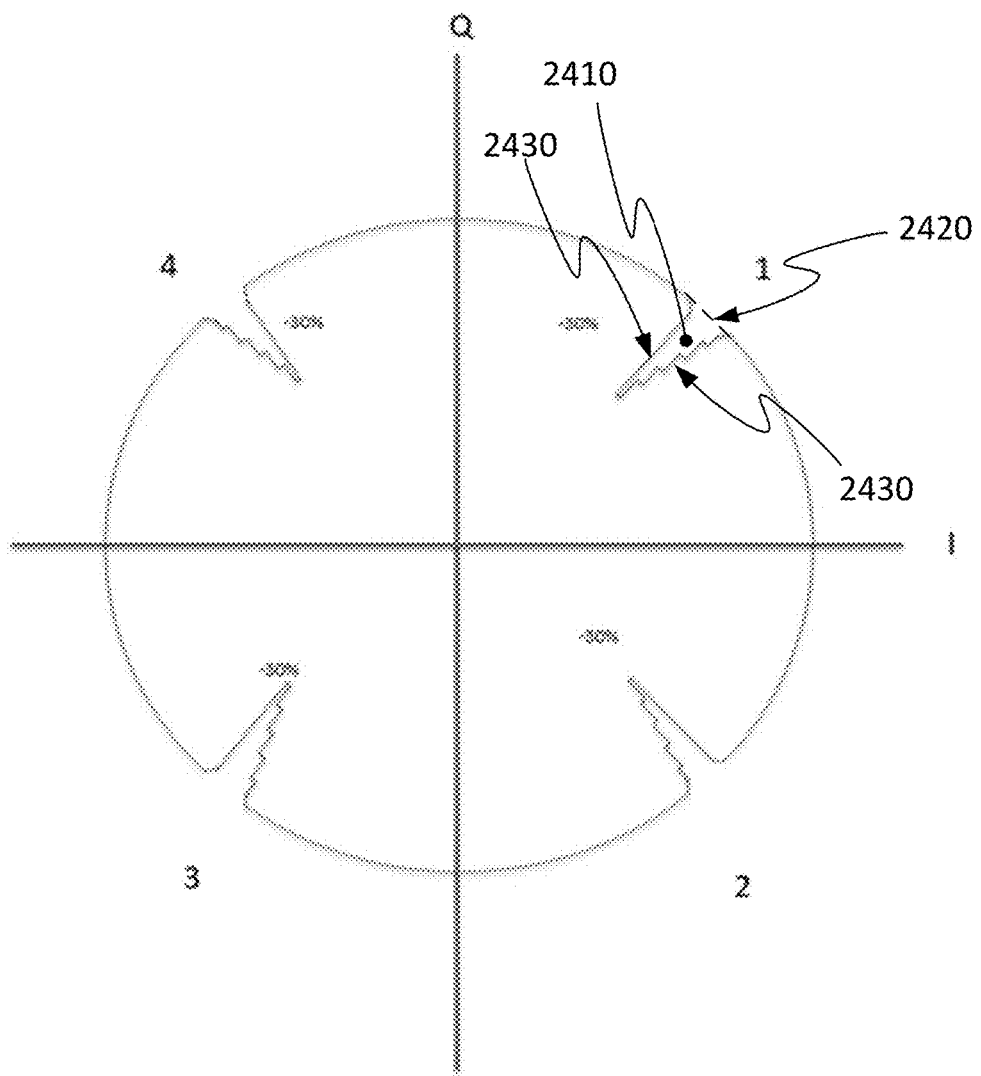
FIG. 24 illustrates an area bounded by an unmodulated sinusoid and a multi-bit data notch.

Upon determining the input data rate exceeds the predefined data rate, in one embodiment the energy-balancing encoded sine wave generator 2310 performs the following sequence of operations to generate an energy-balanced encoded sine wave having multi-bit notch features at the phase angles of 45°, 135°, 225° and 315°. First, the energy-balancing encoded sine wave generator 2310 reads in data from the LDPC coder 2220 corresponding to a first multi-bit data notch at 45°. The generator 2310 then determines step widths of an N-bit stair pattern to be defined in the data notch centered at 45°. For example, relatively narrow steps in the pattern may represent a "1" in the input data and wider steps may represent a "0" in the input data. Other step-like features may be used to represent binary values within the scope of the present disclosure. See, e.g., FIGS. 6-9. After defining the N-bit stair pattern for the data notch at 45°, the signal energy associated with this data notch is computed or otherwise approximated. Again, the energy of the data notch at 45° corresponds to the cumulative difference in power between an unmodulated sine wave and the data notch over the angle subtended by the data notch. See, e.g., FIG. 24, which illustrates an area 2410 bounded by an unmodulated sinusoid 2420 and a multi-bit data notch 2430. The area 2410 is related to this cumulative power difference and may be denoted as the first master area.

Next, the energy-balancing encoded sine wave generator 2310 reads in data from the LDPC coder 2220 corresponding to a second multi-bit data notch at 135°. The generator 2310 then determines, based upon this data, step widths of a second N-bit stair pattern to be defined in the data notch centered at 135° and computes its area. The generator 2310 may then either (i) adjust an area of the second notch at 135° to match the first master area (e.g., by adjusting bit values at the edge of the notch width), or (ii) compute the area of the second multi-bit data notch at 135° after defining the second N-bit stair pattern and denote this are as the second master area.

The energy-balancing encoded sine wave generator 2310 reads in data from the LDPC coder 2220 corresponding to a third multi-bit data notch at 225°. The generator 2310 then determines, based upon this data, step widths of a third N-bit stair pattern to be defined in the data notch centered at 225° and computes its area. The generator 2310 then adjusts the area of the third multi-bit data notch at 225° to match the first master area (e.g., by adjusting bit values at the edge of the third multi-bit data notch).

The energy-balancing encoded sine wave generator 2310 reads in data from the LDPC coder 2220 corresponding to a fourth multi-bit data notch at 315°. The generator 2310 then determines, based on the data, step widths of a fourth N-bit stair pattern to be defined in the fourth multi-bit data notch centered at 315° and computes its area. The generator 2310 then adjusts the area of the fourth multi-bit data notch at 315° to match the second master area (e.g., by adjusting bit values at the edge of the fourth multi-bit data notch).

If the generator 2310 is unsuccessful in forcing the area of the second and fourth multi-bit data notches (i.e., the multi-bit data notches centered at 135° and 315°) and/or is unsuccessful in matching the areas of the first and third multi-bit data notches, the generator 2310 may alter the relative positions of bits in the second and fourth multi-bit data notches. After altering these bit positions, the generator 2310 will again attempt to adjust values defining the edges of the second and fourth multi-bit data notches to cause their respective areas to match. Essentially the same bit rearrangement procedure may be followed to the extent the generator 2310 is initially unsuccessful in achieving a match between the areas of first and third multi-bit data notches by, for example, modifying the values defining edges of these notches. To the extent any data bits are reordered when defining any of the multi-bit data notches, the changed positions may be communicated to a receiver in a separate data channel also containing the CRC information.

As discussed above, the encoded sine waves described herein may be digitally generated in such a way so as to substantially avoid the creation of harmonics or sidebands. Embodiments of the disclosed modulation techniques also enable channel bandwidths containing the modulated signal energy to be 10 Hz or less. That is, the inventor has been unable to discern, using conventional spectrum analyzers, any appreciable spreading of the spectrum of the modulated signal in the frequency domain beyond a few Hz from the carrier frequency of the modulated signal. This is believed to represent a significant advance in the state of the art, since conventional modulation techniques typically generate sidebands or otherwise utilize substantial frequency spectrum, requiring either that the sinusoidal carrier itself or the sidebands resulting from the modulation be suppressed or otherwise filtered. These characteristics of the disclosed modulation technique permit modulated sine waves to be spaced very closely without materially interfering with each other, thus enabling spectrum to be utilized more efficiently than is possible using conventional modulation techniques.

Figure 25:
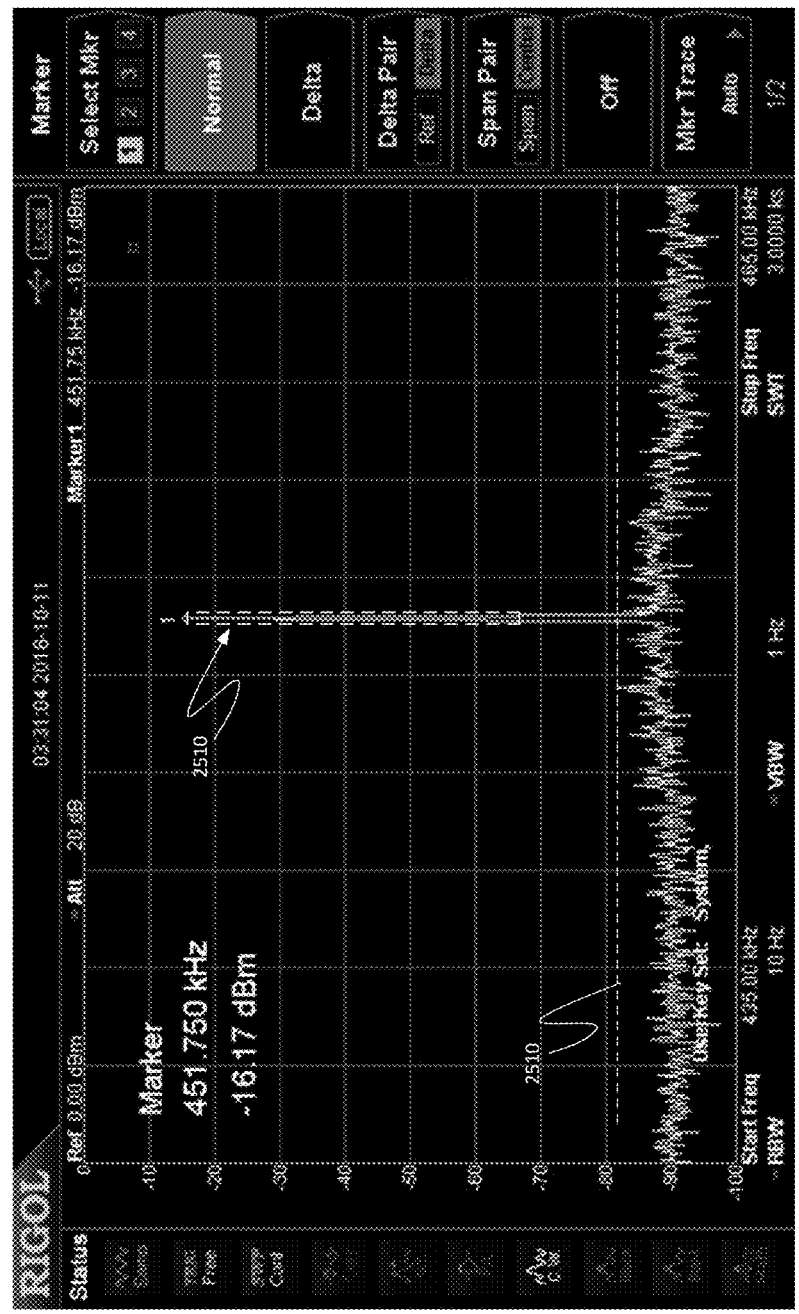
FIG. 25 is a screenshot generated by a spectrum analyzer when provided with an encoded sinusoid modulated with data notches at 45°, 135°, 225° and 315°.

FIG. 25 is a screenshot generated by a spectrum analyzer when provided with an encoded sinusoid modulated with data notches at 45°, 135°, 225° and 315°. Each data notch encodes 1 bit of data by being reduced in power by 15% (for a value of 1) or 30% (for a value of 0) relative to an unmodulated sinusoid, thereby resulting in 4 bits of data being encoded during each sine wave period. As shown, the encoded sinusoid is of a frequency of 451.75 kHz and has a measured power of −16.17 dBm, which is more than 60 dB above an upper level 2510 of the noise floor. As may be appreciated from FIG. 25, the encoded sinusoid occupies an extremely narrow frequency spectrum, represented by the dashed box 2520. Indeed, it is believed that the channel bandwidth occupied by the encoded sinusoid is 10 Hz or less, and that any indication to the contrary in FIG. 25 results from limitations in the capabilities of the subject spectrum analyzer.

As may be appreciated from FIG. 25, the inventor has found that when an encoded analog waveform of a frequency f and a power P is generated from a digital representation of a sinusoid encoded at selected phase angles using the energy-balanced modulation techniques described herein, any signal of frequency f' resulting from the encoding is of a power P' at least 50 dB less than power P, where f' is offset from f by more than 25 Hz. Again, it is believed that this is a conservative characterization of the benefits of the disclosed encoding scheme and is limited by the capabilities and instant measurement settings of the subject spectrum analyzer.

Figure 26A:
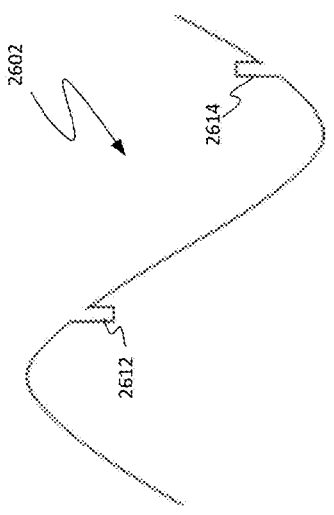
FIGS. 26A-26C illustrate various alternate data encoding schemes in accordance with the disclosure.
Figure 26B:
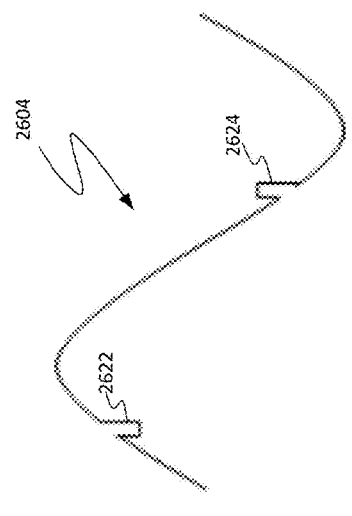
Figure 26C:
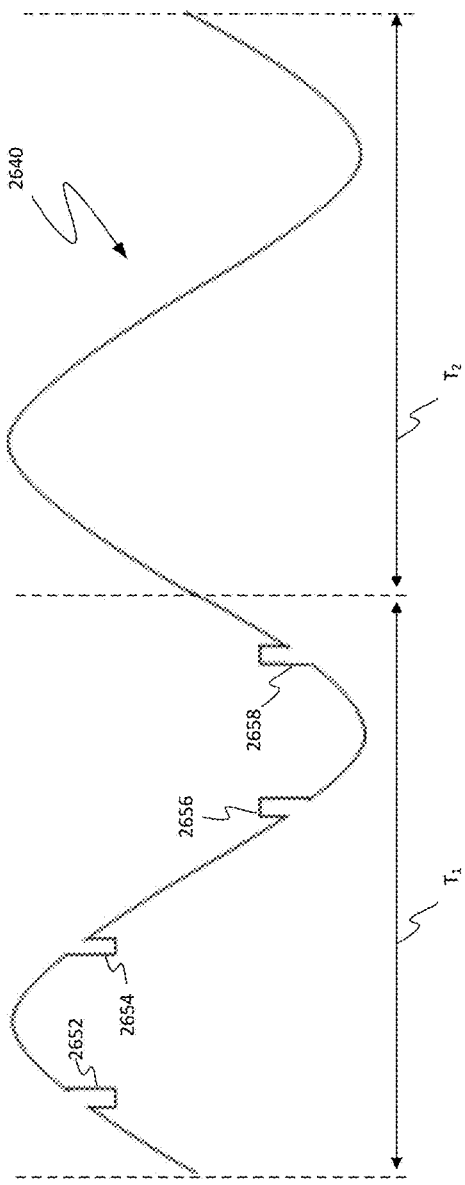

Turning now to FIGS. 26A-26C, various alternate data encoding schemes in accordance with the disclosure are illustrated. In one embodiment a sinusoid may be encoded at a pair of selected phase angles separated by 180° in order to represent a single bit of data. For example, in the embodiment of FIGS. 26A-26B, encoded sinusoid 2602 may represent a value of 0 and encoded sinusoid 2604 may represent a value of 1. As shown, encoded sinusoid 2602 includes a first data notch 2612 and a second data notch 2614. The first data notch is centered at 135° and subtends an angle of approximately 1° and the second data notch 2614 is centered at 315° and also subtends an angle of approximately 1°. In the embodiment of FIGS. 26A-26B, the areas of the first and second data notches 2612 and 2614 are substantially identical and the data notches 2612 and 2614 are energy balanced.

Similarly, encoded sinusoid 2604 includes a first data notch 2622 and a second data notch 2624. The first data notch is centered at 45° and subtends an angle of approximately 1° and the second data notch 2624 is centered at 225° and also subtends an angle of approximately 1°. In the embodiment of FIGS. 26A-26B, the areas of the first and second data notches 2622 and 2624 are substantially identical and the data notches 2622 and 2624 are energy balanced.

FIG. 26C illustrates another manner in which sinusoids encoded at selected phase angles may be used to represent binary data. As shown, FIG. 26C depicts two periods of encoded sinusoid 2640; namely, a first period $T_1$ and a second period $T_2$. In the embodiment of FIG. 26 the first period $T_1$ of the sinusoid 2640 represents a data value of 1 and the second period $T_2$ represents a data value of 0. That is, in the embodiment of FIG. 26C the presence of the data notches 2652, 2654, 2656 and 2658 at the phase angles of 45°, 135°, 225° and 315° during the first period $T_1$ represents a data value of 1, and the absence of data notches at these phase angles represents a data value of 0. In the embodiment an energy associated with the data notch 2652 is the same as an energy associated with the data notch 2656, and an energy associated with the data notch 2654 is the same as an energy associated with the data notch 2658.

FIGS. 27A and 27B illustrate sinusoids encoded in an energy-balanced manner using data notches of alternative shapes. As shown, FIG. 27A depicts a first encoded sinusoid 2710 having somewhat U-shaped data notches 2712, 2714, 2716 and 2718 at the phase angles of 45°, 135°, 225° and 315°. FIG. 27B depicts a second encoded sinusoid 2740 having somewhat V-shaped data notches 2742, 2744, 2746 and 2748 at the phase angles of 45°, 135°, 225° and 315°. Provided that the data notches separated by 180° within a given sinusoidal period are energy balanced, it has been found that the data notch shapes illustrated in FIGS. 27A and 27B and other alternative shapes enable the encoding of information at selected phase angles of a sinusoid without creating measurable energy at frequencies offset from the frequency of the sinusoid by as little as 5 Hz.

Figure 28:
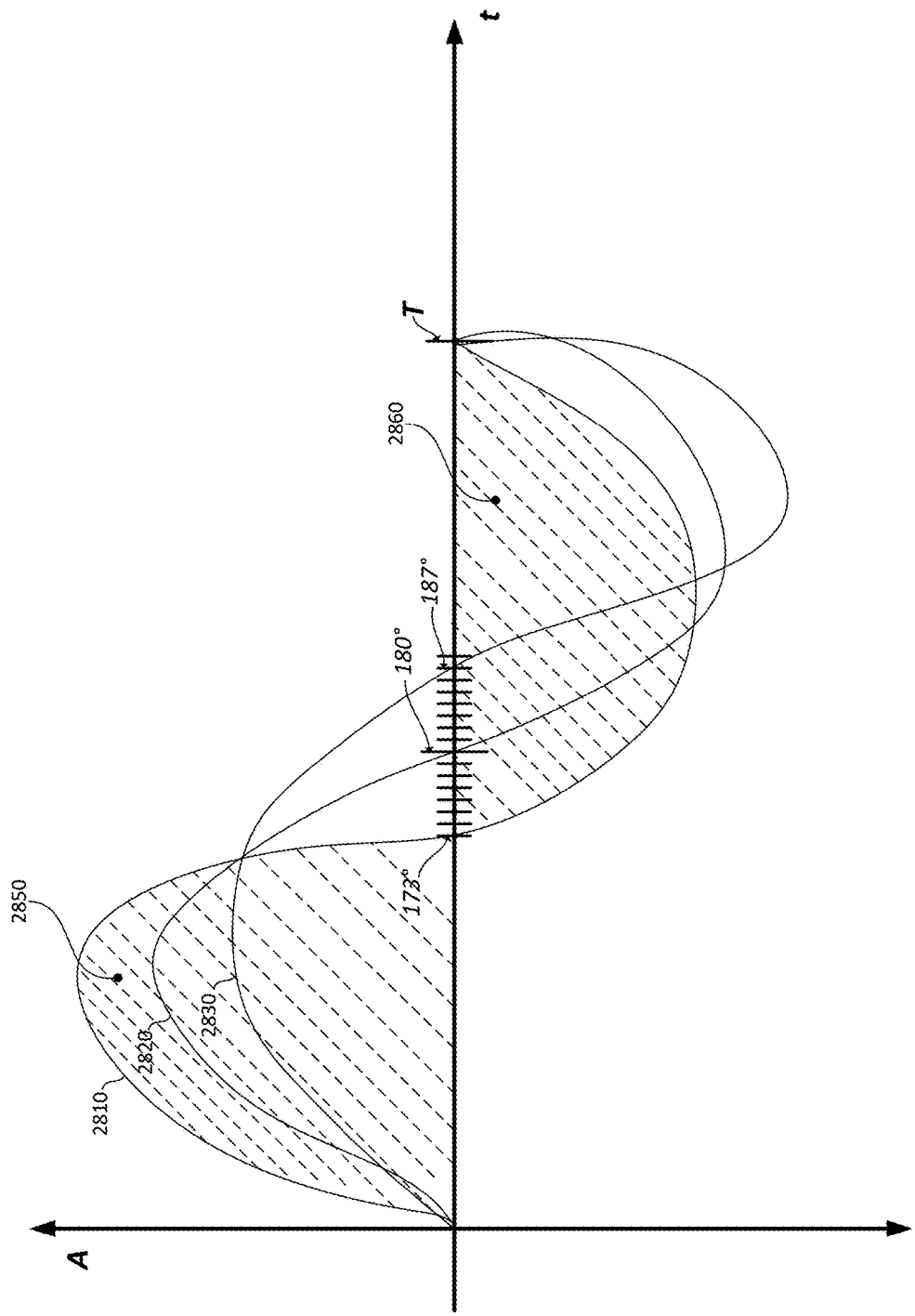
FIG. 28 illustrates elliptical waveforms encoded in an energy-balanced manner in accordance with the disclosure.

Attention is now directed to FIG. 28, which illustrate elliptical waveforms encoded in an energy-balanced manner in accordance with the disclosure. In the embodiment of FIG. 28, each elliptical waveform is of period T and crosses zero at one of sixteen potential zero-crossing phases. In one embodiment a set of sixteen waveforms having different zero crossing phases and identical periods T are employed as modulation symbols. In particular, each symbol waveform may uniquely represent a 4-bit data word corresponding to the zero-crossing phase of the waveform. For example, a first elliptical waveform 2810 of the sixteen elliptical waveforms having a zero-crossing phase of 173° could represent the data word A second elliptical waveform 2820 having a zero-crossing phase of 180° could, for example, represent the data word [0000], and a third elliptical waveform 2830 having a zero-crossing phase of 187° could represent the data word [0111].

In order to minimize or eliminate the creation of sidebands or other signal energy outside of a very narrow channel bandwidth (i.e., a frequency band of 10 Hz or less centered at the carrier frequency f, where f=1/T), it has been found that each elliptical waveform should be energy balanced. That is, an energy associated with the positive half cycle of the waveform should equal an energy associated with the negative half cycle of the waveform. In the embodiment of FIG. 28, the energy of the positive half cycle 2850 of the first elliptical waveform 2810 should be equal to the energy of the negative half cycle 2860 of the elliptical waveform 2810 in order to inhibit or prevent sidebands or other signal energy from being created outside of a desired narrow channel bandwidth. As shown in FIG. 28, each of the elliptical waveforms is of a different maximum and minimum amplitude (A) as a consequence of the different zero-crossing points of each elliptical waveform and the balancing of the energy of the positive and negative half cycles of each waveform.

Figure 29:
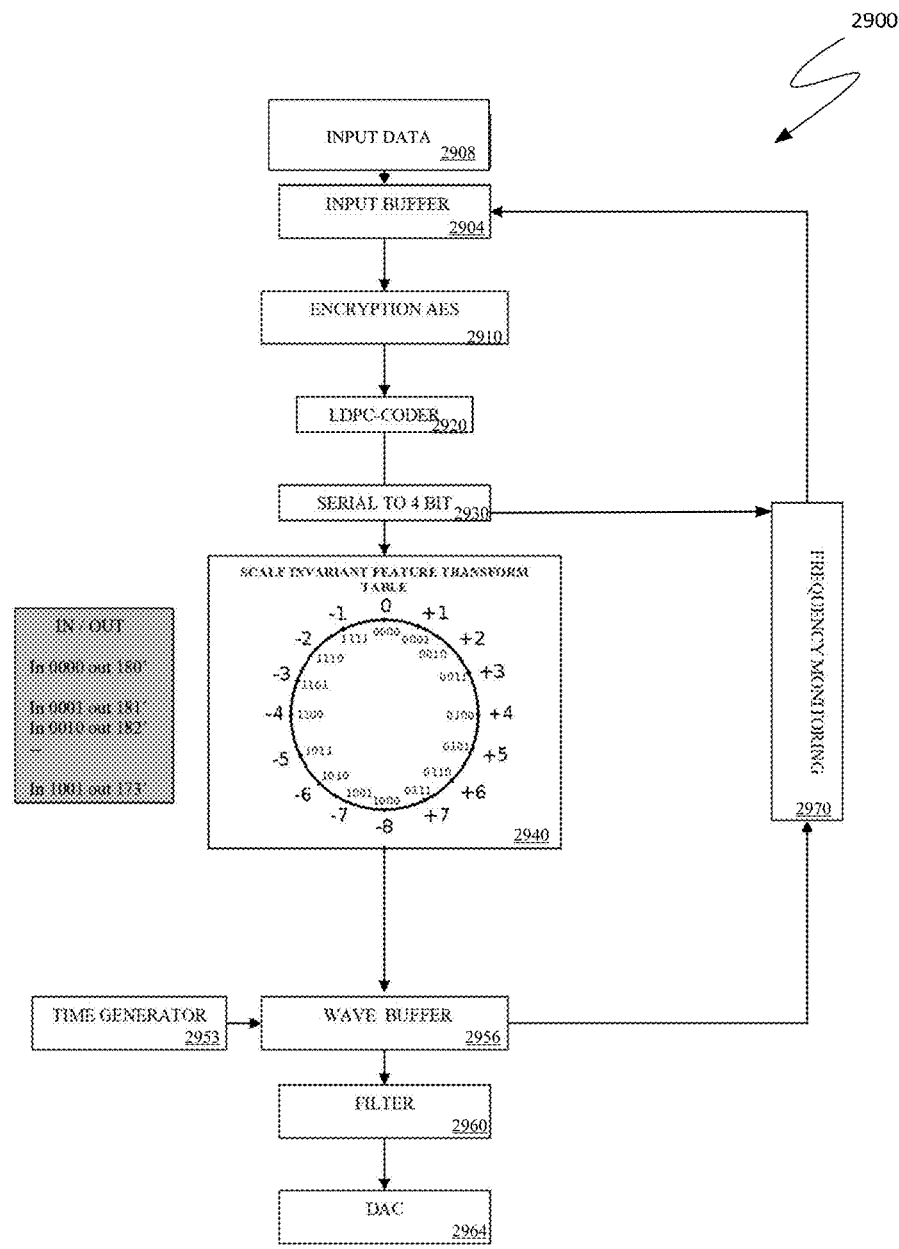
FIG. 29 is a functional block diagram of an embodiment of an energy-balancing transmitter configured to generate and transmit zero-crossing-phase-modulated elliptical waveforms of the type illustrated in FIG. 28.

Attention is now directed to FIG. 29, which is a functional block diagram of an embodiment of an energy-balancing transmitter 2900 configured to generate and transmit zero-crossing-phase-modulated elliptical waveforms of the type illustrated in FIG. 28. As shown, the transmitter 2900 includes an input buffer 2904 for storing digital input data 2908, a data optimization unit in the form of an AES encryption module 2910, an LDPC coder 2920 and a serial to 4-bit data word converter 2930. In one embodiment the transmitter 2900 may be implemented using, for example, an FPGA.

During operation of the transmitter 2900, input data has been stored within the input buffer 2904 is provided to the AES encryption module 2910. In one embodiment the AES encryption module 2910 aids in detection of the data at a receiver by processing the input data to limit the run length of strings of the same logical value. The resulting output produced by the AES encryption module 2910 is provided to the LDPC coder 2920, which performs LDPC error correcting coding operations. The serial data stream produced by the LDPC coder 2920 is then converted into a sequence of 4-bit data frames by the serial to 4-bit data word converter 2930.

A scale-invariant feature transform table 2940 receives each 4-bit data word provided by the serial to 4-bit data word converter 2930 and identifies one of 16 zero-crossing-phase-modulated elliptical waveforms stored therein corresponding to the 4-bit data word. In one embodiment the table 2940 stores data values (e.g., 3600 data values) corresponding to a single period of each of the 16 zero-crossing-phase-modulated elliptical waveforms corresponding to each of the 16 possible values of the 4-bit data words provided by the data word converter 2930. In response to the sequence of 4-bit data words provided by the data word converter 2930, the data values defining each successive zero-crossing-phase-modulated elliptical waveforms are read from the table 2940 and stored within the wave buffer 2956. For example, in response to receipt of the 4-bit digital word [1001], the table 2940 may be configured to produce, and store within the wave buffer 2956, a set of digital values defining the first elliptical waveform 2810, which has a zero-crossing phase of 173°.

A time generator 2953 provides a clocking signal to the wave buffer 2956 so that a relatively constant data rate is maintained into the filter 2960. Since the data rate of the input data provided to the input buffer 2904 may be somewhat bursty or otherwise irregular, the time generator 2953 functions to essentially remove the resulting jitter from the data stream produced by the scale-invariant feature transform table 2940 before it is provided to the filter 2960.

The energy-balanced elliptical waveforms stored within the wave buffer 2956 are optionally pre-distorted or otherwise filtered by a filter 2960 prior to being converted to analog signals by a digital-to-analog converter 2964. The resulting encoded analog signals and transmitted via either a wired or wireless communication medium.

In one embodiment the transmitter 2900 includes a frequency monitoring/flow control module 2970 operative to control the data rate into the scale-invariant feature transform table 2940. Specifically, the flow control module 2970 monitors the data rate out of the data converter 2930 and into the wave buffer 2956. When the data rate out of the data rate converter 2930 begins to exceed the data rate into the wave buffer 2956, the flow control module 2970 sends 4-bit frames from the converter 2930 back to the input buffer 2904 until these data rates are equalized.

Figure 30:
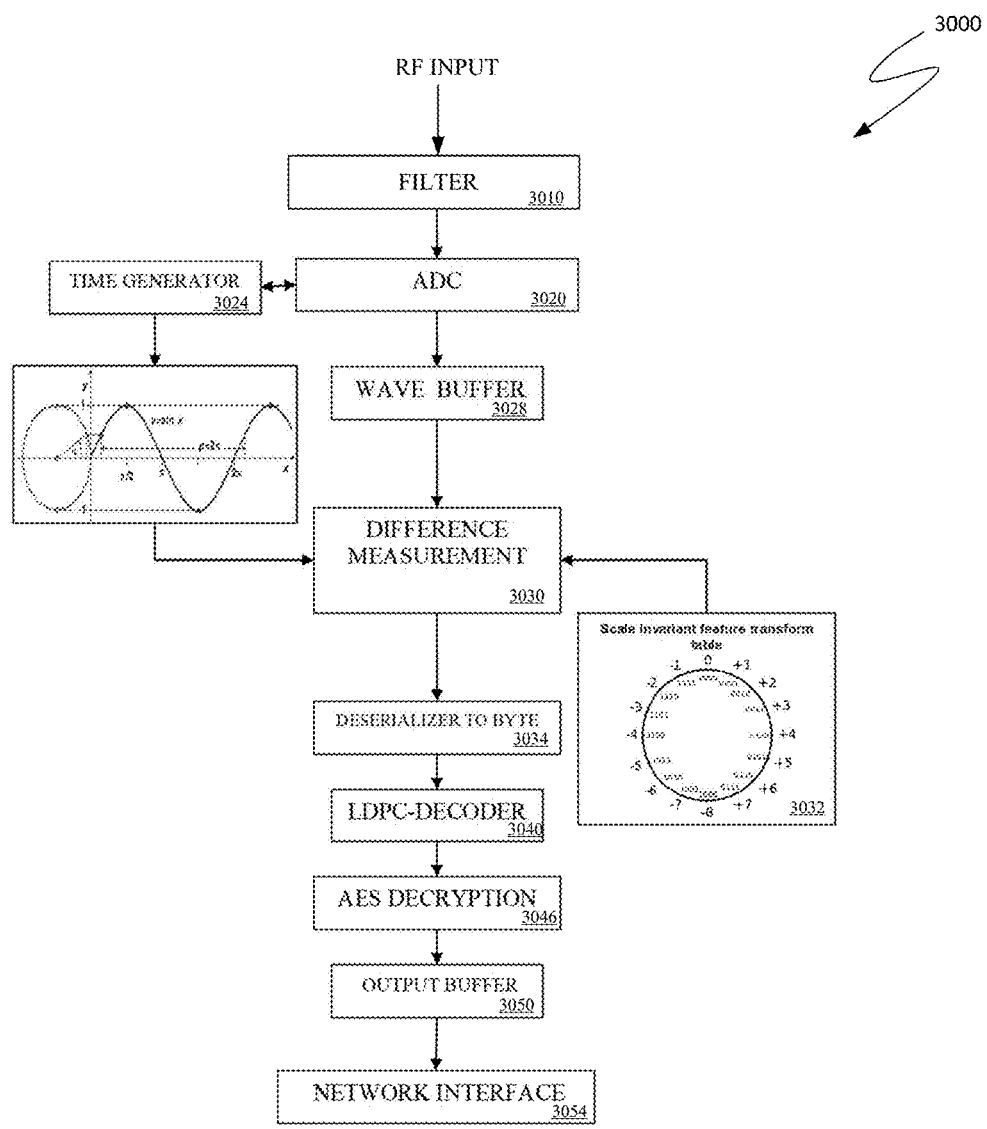
FIG. 30 is a functional block diagram of a receiver configured to receive and demodulate zero-crossing-phase-modulated elliptical waveforms.

Attention is now directed to FIG. 30, which is a functional block diagram of a receiver 3000 configured to receive and demodulate zero-crossing-phase-modulated elliptical waveforms transmitted by a transmitter configured to produce and transmit such zero-crossing-phase-modulated elliptical waveforms. For example, the receiver 3000 is capable of receiving and demodulating zero-crossing-phase-modulated elliptical waveforms transmitted by the transmitter 2900. As shown, the receiver includes a filter 3010 which receives such waveforms, filters extraneous channel noise, and provides the filtered result to an analog-to-digital converter (ADC) 3020.

A time generator 3024 clocks or otherwise controls the output data rate of the ADC 3020. Digital amplitude values for each received waveform are generated by the ADC 3020 and provided to a wave buffer 3028. Once the receiver 3000 has achieved time synchronization with a received elliptical waveform (e.g., by detecting negative-to-positive zero crossings of the received waveform), the ADC 3020 generates samples of the received elliptical waveform at a rate based upon the output of a time generator 3024. The signal samples produced by the ADC 3020 are provided to a wave buffer 3028.

Once time synchronization with a received waveform has been achieved, a difference measurement module 3030 determines differences between samples of a period of the waveform within the wave buffer 3028 and samples of a sine wave of the same period provided by the time generator 3024. In a higher-resolution embodiment such differences are determined every 0.1° from 0 to 360° (3600 sample differences per period of the waveform). In lower-resolution embodiments such differences are determined every 1° from 0 to 360° (360 sample differences per period of the waveform). The difference measurement module 3030 aggregates these sample differences for a given period and uses the aggregate difference value as an index into a table 3032 that stores a data word corresponding to each aggregate difference. For example, in the case in which each period of the received elliptical waveform may have one of 16 different positive-to-negative zero crossing phases, the table 3032 includes a set of 16 4-bit data words corresponding to each of these zero-crossing phases. That is, each of the aggregated difference values is mapped by the table 3032 to one of the 4-bit data words. For example, as shown by the table 3032, one of the aggregate difference values could correspond to a "+1" aggregate difference, which is mapped to a data word of 0001. Another of the aggregate difference values could correspond to a "−3" aggregate difference, which is mapped to a data word of 1101, and so on.

In one embodiment sensitivity may be enhanced by configuring the ADC 3020 to only operate during certain phase ranges of the received elliptical waveforms. In this embodiment, once the receiver 3000 has achieved time synchronization with a received energy-balanced encoded sine wave, ADC 3020 may be gated "on" so as to only generate sample values in the vicinity of the zero crossings proximate the 180° point of each period. For example, the ADC 3020 may be turned on only for a time period corresponding to phases spanning the potential zero-crossing phases of interest, e.g., 173° to 187° or slightly wider. Thus, in one embodiment sensitivity is enhanced by configuring the ADC 3020 to sample over a relatively small portion of each period.

The data words produced by the measurement module 3030 are provided to a deserializer-to-byte unit 3034, which produces a series of logical values representing the bit values encoded by the zero-crossing phases of the periods of the received elliptical waveform. The logical values generated by the byte unit 3034 are then provided to an LDPC decoder 3040 configured to remove the LDPC encoding applied by the applicable transmitter (e.g., the transmitter 2900) from which the received elliptical waveform was transmitted. Similarly, an AES decryption unit 3046 reverses the encryption applied by a corresponding AES encryption unit in the applicable transmitter. The output of the AES decryption unit 3046 may then be provided to an output buffer 3050. In one embodiment the receiver 3000 searches bit sequences within the output buffer 3050 for a preamble data bit string (e.g., a 0x47 string) signifying the start of a packet. In an exemplary implementation the encoded sine waves received by the receiver 3000 carry frames of 1500 bits. Each frame begins with a predefined bit string (e.g., 0x47) and is followed by the data being communicated. Once the preamble has been identified within the output buffer 3050, an estimate of the data being communicated may be provided to a local area network (LAN) or the like via a network interface 3054. Alternatively, the entire contents of the output buffer 3050 may be provided to an external system configured to identify the preamble for each frame and recover the data conveyed by the frame.

The disclosure discussed herein provides and describes examples of some embodiments of the system for data communication with high spectral efficiency. The designs, figures, and descriptions are non-limiting examples of selected embodiments of the disclosure. For example, other embodiments of the disclosed device may or may not include the features described herein. Moreover, disclosed advantages and benefits may apply to only certain embodiments of the disclosure and should not be used to limit the various disclosures.

As used herein, coupled means directly or indirectly connected by a suitable means known to persons of ordinary skill in the art. Coupled items may include interposed features such as, for example, A is coupled to C via B. Unless otherwise stated, the type of coupling, whether it be mechanical, electrical, fluid, optical, radiation, or other is indicated by the context in which the term is used.

As used in this specification, a module can be, for example, any assembly and/or set of operatively-coupled electrical components associated with performing a specific function(s), and can include, for example, a memory, a processor, electrical traces, optical connectors, software (that is stored in memory and/or executing in hardware) and/or the like.

As used in this specification, the singular forms "a," "an" and "the" include plural referents unless the context clearly dictates otherwise. Thus, for example, the term "an actuator" is intended to mean a single actuator or a combination of actuators.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but can be implemented using a variety of alternative architectures and configurations. Additionally, although the invention is described above in terms of various embodiments and implementations, it should be understood that the various features and functionality described in one or more of the individual embodiments are not limited in their applicability to the particular embodiment with which they are described, but instead can be applied, alone or in some combination, to one or more of the other embodiments of the invention, whether or not such embodiments are described and whether or not such features are presented as being a part of a described embodiment. Thus the breadth and scope of the present invention should not be limited by any of the above-described embodiments.

Some embodiments described herein relate to a computer storage product with a non-transitory computer-readable medium (also can be referred to as a non-transitory processor-readable medium) having instructions or computer code thereon for performing various computer-implemented operations. The computer-readable medium (or processor-readable medium) is non-transitory in the sense that it does not include transitory propagating signals per se (e.g., a propagating electromagnetic wave carrying information on a transmission medium such as space or a cable). The media and computer code (also can be referred to as code) may be those designed and constructed for the specific purpose or purposes. Examples of non-transitory computer-readable media in which the KCM may reside include, without limitation, one time programmable (OTP) memory, protected Random-Access Memory (RAM) and flash memory.

Examples of computer code include, but are not limited to, micro-code or micro-instructions, machine instructions, such as produced by a compiler, code used to produce a web service, and files containing higher-level instructions that are executed by a computer using an interpreter. For example, embodiments may be implemented using imperative programming languages (e.g., C, Fortran, etc.), functional programming languages (Haskell, Erlang, etc.), logical programming languages (e.g., Prolog), object-oriented programming languages (e.g., Java, C++, etc.) or other suitable programming languages and/or development tools. Additional examples of computer code include, but are not limited to, control signals, encrypted code, and compressed code.

While various embodiments have been described above, it should be understood that they have been presented by way of example only, and not limitation. Where methods described above indicate certain events occurring in certain order, the ordering of certain events may be modified. Additionally, certain of the events may be performed concurrently in a parallel process when possible, as well as performed sequentially as described above. Although various modules in the different devices are shown to be located in the processors of the device, they can also be located/stored in the memory of the device (e.g., software modules) and can be accessed and executed by the processors. Accordingly, the specification is intended to embrace all such modifications and variations of the disclosed embodiments that fall within the spirit and scope of the appended claims.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of" will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of" "only one of" or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A method of recovering input digital data encoded by amplitude perturbations at respective phase angles of a modulated sinusoidal waveform wherein cumulative power reductions associated with at least two of the amplitude perturbations are matched, the method comprising:
receiving the modulated sinusoidal waveform;
generating digital values representing the modulated sinusoidal waveform;
subtracting a digital representation of an unmodulated sinusoidal waveform from the digital values in order to generate a received digital data sequence including perturbation values representative of the amplitude of the modulated sinusoidal waveform within the perturbations; and
estimating the input digital data based upon the perturbation values;
wherein the amplitude perturbations include first, second, third, and fourth amplitude
perturbations and wherein the respective phase angles include a first phase angle $\Theta_1$, a second phase angle $\Theta_2$, a third phase angle $\Theta_3$, and a fourth phase angle $\Theta_4$; and
wherein a first cumulative power difference between a power of the modulated sinusoidal
waveform and a power of the unmodulated sinusoidal waveform over a first phase angle range subtended by the first amplitude perturbation matches a third cumulative power difference between the power of the modulated sinusoidal waveform and the power of the unmodulated sinusoidal waveform over a third phase angle range subtended by the third amplitude perturbation.

2. The method of claim 1 wherein the subtracting includes detecting zero crossings of the digital values representing the modulated sinusoidal waveform.

3. The method of claim 1 further including detecting a preamble within the received digital data sequence.

4. The method of claim 1 wherein
a second cumulative power difference between the power of the modulated sinusoidal waveform and the power of the unmodulated sinusoidal waveform over a second phase angle range subtended by the second amplitude perturbation matches a fourth cumulative power difference between the power of the modulated sinusoidal waveform and the power of the unmodulated sinusoidal waveform over a fourth phase angle range subtended by the fourth amplitude perturbation.

5. The method of claim 1 wherein the phase angle $\Theta_3$ is equal to the sum of the phase angle $\Theta_1$ and 180° and the phase angle $\Theta_4$ is equal to the sum of the phase angle $\Theta_2$ and 180°.

6. The method of claim 1 wherein the phase angle $\Theta_1$ is between 44.5° and 45.5°, the phase angle $\Theta_2$ is equal to 134.5° to 135.5°, the phase angle $\Theta_3$ is equal to 224.5° to 225.5°, and the phase angle $\Theta_4$ is equal to 314.5° to 315.5°.

7. The method of claim 1 wherein the first, second, third, and fourth amplitude perturbations respectively include first, second third and fourth data notches and wherein the first data notch is representative of a first bit value of the input digital data and the second data notch is representative of a second bit value of the input digital data.

8. The method of claim 1 wherein the first, second, third, and fourth amplitude perturbations respectively include first, second third and fourth data notches and wherein the first data notch is representative of a first plurality of bit values of the input digital data, the first data notch including a first plurality of transition features respectively representative of the first plurality of the bit values.

9. The method of claim 1 wherein the input digital data includes 1 bit values and 0 bit values and wherein the input digital data is scrambled to prevent more than a predefined number of 0 bit values from occurring in sequence and more than a predefined number of 1 bit values from occurring in sequence.

10. The method of claim 1 wherein:
the amplitude perturbations include first, second third and fourth data;
the power of the modulated sinusoidal waveform is reduced relative to the power of an unmodulated sinusoidal waveform by a first percentage to encode a first digital value of the input digital data within the selected ones of the first, second, third and fourth data notches, and the power of the modulated sinusoidal waveform is reduced relative to the power of an unmodulated sinusoidal waveform by a second percentage to encode a second digital value of the input digital data within the selected ones of the first, second, third and fourth data notches wherein the first digital value is different from the second digital value.

11. The method of claim 1 wherein the amplitude perturbations include first, second third and fourth data notches, and wherein the power of the modulated sinusoidal waveform is reduced in accordance with the input digital data only at the phase angles $\Theta_1$ and $\Theta_3$.

12. The method of claim 4 wherein the first phase angle range, the second phase angle range, the third phase angle range and the fourth phase angle range are each less than or equal to 1°.

13. The method of claim 7 wherein a minimum power of the first data notch is a first percentage of the power of the unmodulated sinusoidal waveform at the phase angle $\Theta_1$ and a minimum power of the second data notch is a second percentage of the power of the unmodulated sinusoidal waveform at the phase angle $\Theta_2$, the first percentage being different from the second percentage.

14. The method of claim 9 wherein the third data notch is representative of a second plurality of bit values of the input digital data, the third data notch including a second plurality of transition features respectively representative of the second plurality of the bit values.

15. The method of claim 8 wherein the first data notch includes generally opposing first and second side portions, the first side portion defining a first set of the first plurality of transition features and the second side portion defining a second set of the first plurality of transition features.

16. The method of claim 8 wherein each of the plurality of transition features defines a step change in an amplitude of the modulated sinusoidal waveform.

17. The method of claim 11 wherein the power of the modulated sinusoidal waveform is reduced for energy balancing purposes at the phase angles $\Theta_2$ and $\Theta_4$ independent of the input digital data.

18. The method of claim 14 wherein the second plurality of the bit values is different from the first plurality of the bit values.

19. The method of claim 14 wherein the first data notch includes generally opposing first and second side portions, the first side portion being linear and the second side portion defining the first plurality of transition features.

20. The method of claim 15 wherein the first set of the first plurality of transition features includes a first number of transition features and the second set of the first plurality of transition features includes the first number of transition features.

21. The method of claim 19 wherein the third data notch includes generally opposing third and fourth side portions, the fourth side portion being linear and the third side portion defining the first plurality of transition features.

22. The method of claim 21 wherein the modulated sinusoidal waveform defines the first side portion in the time domain earlier than the modulated sinusoidal waveform defines the second side portion and wherein the modulated sinusoidal waveform defines the third side portion in the time domain earlier than the modulated sinusoidal waveform defines the fourth side portion.

23. A system for recovering information encoded by a modulated sinusoidal waveform having first, second, third and fourth amplitude perturbations at respective phase angles $\Theta_1$, $\Theta_2$, $\Theta_3$, $\Theta_4$ wherein a power of the modulated sinusoidal waveform is reduced relative to a power of an unmodulated sinusoidal waveform within selected ones of the first, second, third and fourth amplitude perturbations so as to encode input digital data, the system comprising:
one or more analog-to-digital converters for generating digital values representing the modulated sinusoidal waveform;
an input buffer for storing the digital values;
a sine wave subtraction apparatus for subtracting a digital representation of the unmodulated sinusoidal waveform from the digital values in order to generate a received digital data sequence including digital amplitude perturbation values representative of the amplitude of the modulated sinusoidal waveform within the first, second, third and fourth amplitude perturbations; and a sub-periodic time domain demodulator for estimating the input digital data based upon the digital amplitude perturbation values;

wherein a first cumulative power difference between a power of the modulated sinusoidal waveform and a power of the unmodulated sinusoidal waveform over a first phase angle range subtended by the first amplitude perturbation matches a third cumulative power difference between the power of the modulated sinusoidal waveform and the power of the unmodulated sinusoidal waveform over a third phase angle range subtended by the third amplitude perturbation.

24. The system of claim 23 wherein the sine wave subtraction apparatus includes a zero-crossing detector for detecting zero crossings of the digital values representing the modulated sinusoidal waveform.

25. The system of claim 23 further including a ring buffer having a preamble detector for detecting a preamble within the received digital data sequence.

26. The system of claim 23 wherein the phase angle $\Theta_1$ is between 44.5° and 45.5°, the phase angle $\Theta_2$ is between 134.5° and 135.5°, the phase angle $\Theta_3$ is between 224.5° and 225.5°, and the phase angle $\Theta_4$ is between 314.5° and 315.5°.

27. A method of recovering input data represented by amplitude perturbations at a plurality of phase angles of a modulated sinusoidal waveform wherein at least two of the plurality of phase angles are separated by approximately 180 degrees, the method comprising:

receiving the modulated sinusoidal waveform;

generating data values representing the modulated sinusoidal waveform;

generating a received data sequence including perturbation data values representative of the amplitude of the modulated sinusoidal waveform within the plurality of amplitude perturbations; and estimating the input data based upon the perturbation data values;

wherein a first cumulative power difference between a power of the modulated sinusoidal waveform and a power of an unmodulated sinusoidal waveform over a first phase angle range subtended by a first of the amplitude perturbations matches a second cumulative power difference between the power of the modulated sinusoidal waveform and the power of the unmodulated sinusoidal waveform over a second phase angle range subtended by a second of the amplitude perturbations.

28. The method of claim 27 wherein a power of the modulated sinusoidal waveform is reduced relative to a power of an unmodulated sinusoidal waveform over a plurality of phase angle ranges respectively including the plurality of phase angles.

29. The method of claim 27 wherein cumulative power reductions associated with at least two of the amplitude perturbations are matched.

30. The method of claim 28 wherein the generating the received data sequence includes subtracting a representation of the unmodulated sinusoidal waveform from the data values.

* * * * *